United States Patent
Lin et al.

(10) Patent No.: US 11,552,103 B2
(45) Date of Patent: Jan. 10, 2023

(54) THREE-DIMENSIONAL STACKABLE FERROELECTRIC RANDOM ACCESS MEMORY DEVICES AND METHODS OF FORMING

(71) Applicant: Taiwan Semiconductor Manufacturing Co., Ltd., Hsinchu (TW)

(72) Inventors: Meng-Han Lin, Hsinchu (TW); Bo-Feng Young, Taipei (TW); Han-Jong Chia, Hsinchu (TW); Sheng-Chen Wang, Hsinchu (TW); Feng-Cheng Yang, Zhudong Township (TW); Sai-Hooi Yeong, Zhubei (TW); Yu-Ming Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 235 days.

(21) Appl. No.: 17/018,139

(22) Filed: Sep. 11, 2020

(65) Prior Publication Data
US 2021/0408042 A1   Dec. 30, 2021

Related U.S. Application Data

(60) Provisional application No. 63/044,578, filed on Jun. 26, 2020.

(51) Int. Cl.
*H01L 27/11597* (2017.01)
*G11C 7/18* (2006.01)
(Continued)

(52) U.S. Cl.
CPC .......... *H01L 27/11597* (2013.01); *G11C 7/18* (2013.01); *G11C 11/14* (2013.01); *H01L 27/11587* (2013.01)

(58) Field of Classification Search
CPC ......... H01L 27/11597; H01L 27/11587; H01L 27/1159; H01L 27/11595; H01L 27/11585;
(Continued)

(56) References Cited

U.S. PATENT DOCUMENTS 9,941,333 B2    4/2018 Jeong et al.
10,777,566 B2 *  9/2020 Lue .......................... G11C 11/54
(Continued)

FOREIGN PATENT DOCUMENTS

EP          3499580 A1    6/2019
KR       20120053329 A    5/2012
(Continued)

OTHER PUBLICATIONS

Lue et al., "A Novel 3D AND-type NVM Architecture Capable of High-density, Low-power In-Memory Sum-of-Product Computation for Artificial Intelligence Application," 2018 Symposium on VLSI Technology Digest of Technical Papers, Jun. 18-22, 2018, pp. 177-178.

*Primary Examiner* — Allison Bernstein
(74) *Attorney, Agent, or Firm* — Slater Matsil, LLP

(57) ABSTRACT

A method of forming a ferroelectric random access memory (FeRAM) device includes: forming a first layer stack and a second layer stack successively over a substrate, where the first layer stack and the second layer stack have a same layered structure that includes a layer of a first electrically conductive material over a layer of a first dielectric material, where the first layer stack extends beyond lateral extents of the second layer stack; forming a trench that extends through the first layer stack and the second layer stack; lining sidewalls and a bottom of the trench with a ferroelectric material; conformally forming a channel material in the trench over the ferroelectric material; filling the trench with a second dielectric material; forming a first opening and a (Continued)

second opening in the second dielectric material; and filling the first opening and the second opening with a second electrically conductive material.

20 Claims, 28 Drawing Sheets

(51) Int. Cl.
*G11C 11/14* (2006.01)
*H01L 27/11587* (2017.01)
(58) Field of Classification Search
CPC ........... H01L 29/6684; H01L 29/78391; H01L 27/11514; H01L 27/11551; H01L 27/11578; G11C 7/18; G11C 11/14; G11C 11/223
See application file for complete search history.

(56) References Cited

U.S. PATENT DOCUMENTS

| 10,937,809 | B1 | 3/2021 | Sharangpani et al. |
| 11,133,329 | B2 * | 9/2021 | Lue .......................... G11C 7/18 |
| 2012/0119287 | A1 | 5/2012 | Park et al. |
| 2016/0181259 | A1 | 6/2016 | Van Houdt et al. |
| 2019/0006376 | A1 | 1/2019 | Ramaswamy |
| 2019/0148286 | A1 | 5/2019 | Or-Bach et al. |
| 2019/0245543 | A1 | 8/2019 | Lee et al. |
| 2020/0075858 | A1 | 3/2020 | Pirovano et al. |
| 2020/0105772 | A1 | 4/2020 | Chen et al. |
| 2020/0243134 | A1 | 7/2020 | Fratin et al. |
| 2020/0381290 | A1 | 12/2020 | Ramaswamy |
| 2021/0074357 | A1 | 3/2021 | Derner et al. |
| 2021/0167127 | A1 | 6/2021 | Castro et al. |

FOREIGN PATENT DOCUMENTS

| TW | 201740584 | A | 11/2017 |
| TW | 201842649 | A | 12/2018 |
| TW | 201911537 | A | 3/2019 |
| TW | 201917872 | A | 5/2019 |
| TW | 201946253 | A | 12/2019 |
| TW | 202002246 | A | 1/2020 |
| WO | 2019139622 | A1 | 7/2019 |

* cited by examiner

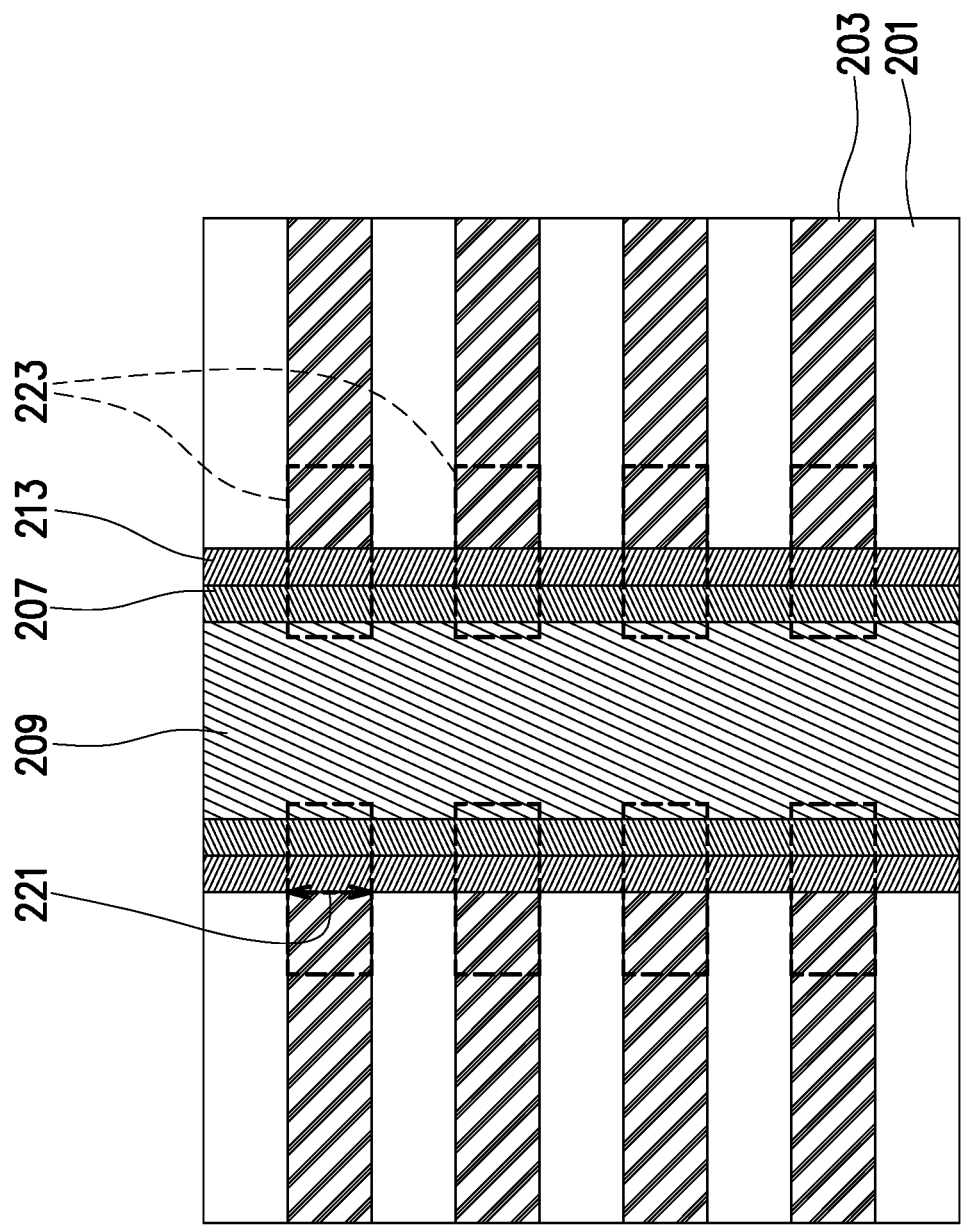

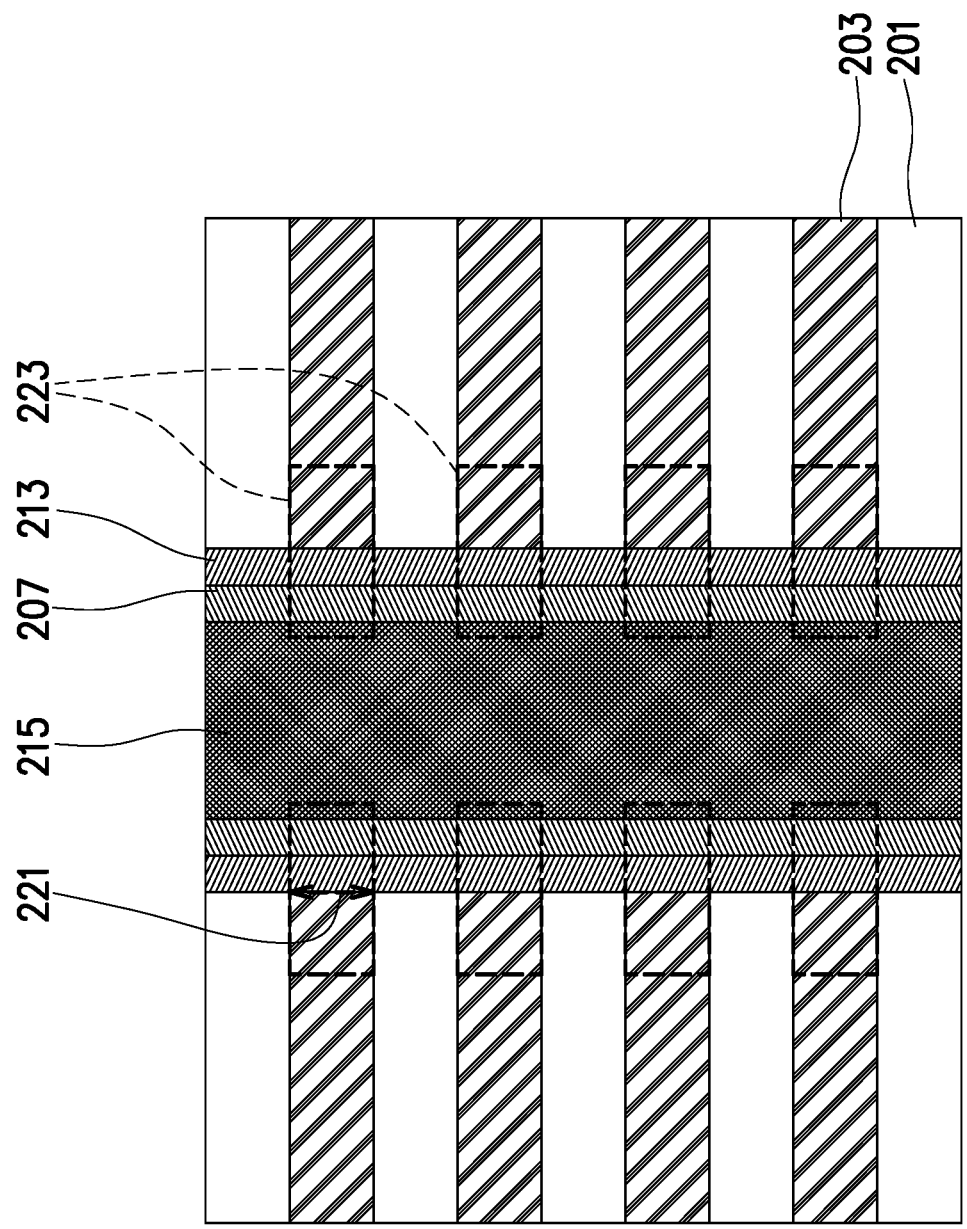

1000

| form a first layer stack and a second layer stack successively over a substrate, wherein the first layer stack and the second layer stack have a same layered structure that includes a layer of a first electrically conductive material over a layer of a first dielectric material, wherein the first layer stack extends beyond lateral extents of the second layer stack | ~1010 |

↓

| form a trench that extends through the first layer stack and the second layer stack | ~1020 |

↓

| line sidewalls and a bottom of the trench with a ferroelectric material | ~1030 |

↓

| conformally form a channel material in the trench over the ferroelectric material | ~1040 |

↓

| fill the trench with a second dielectric material | ~1050 |

↓

| form a first opening and a second opening in the second dielectric material | ~1060 |

↓

| fill the first opening and the second opening with a second electrically conductive material | ~1070 |

THREE-DIMENSIONAL STACKABLE FERROELECTRIC RANDOM ACCESS MEMORY DEVICES AND METHODS OF FORMING

PRIORITY CLAIM AND CROSS-REFERENCE

This application claims the benefit of U.S. Provisional Application No. 63/044,578, filed on Jun. 26, 2020, which application is hereby incorporated herein by reference.

TECHNICAL FIELD

The present invention relates generally to semiconductor memory devices, and, in particular embodiments, to three-dimensional (3D) ferroelectric random access (FeRAM) memory devices.

BACKGROUND

Semiconductor memories are used in integrated circuits for electronic applications, including radios, televisions, cell phones, and personal computing devices, as examples. Semiconductor memories include two major categories. One is volatile memories; the other is non-volatile memories. Volatile memories include random access memory (RAM), which can be further divided into two sub-categories, static random access memory (SRAM) and dynamic random access memory (DRAM). Both SRAM and DRAM are volatile because they will lose the information stored when they are not powered.

On the other hand, non-volatile memories can keep data stored on them without power being supplied. One type of non-volatile semiconductor memory is ferroelectric random access memory (FeRAM, or FRAM). Advantages of FeRAM include its fast write/read speed and small size.

BRIEF DESCRIPTION OF THE DRAWINGS

For a more complete understanding of the present invention, and the advantages thereof, reference is now made to the following descriptions taken in conjunction with the accompanying drawings, in which:

FIGS. 2A, 2B, 3A, 3B, 4-7, 8A, 8B, 8C, 8D, 8E, 9, 10A, and 10B illustrate various views of a three-dimensional (3D) ferroelectric random access memory (FeRAM) device at various stages of manufacturing, in an embodiment;

FIG. 21 illustrates a flow chart of a method of forming a three-dimensional (3D) ferroelectric random access memory (FeRAM) device, in some embodiments.

DETAILED DESCRIPTION OF ILLUSTRATIVE EMBODIMENTS

Figure 1:
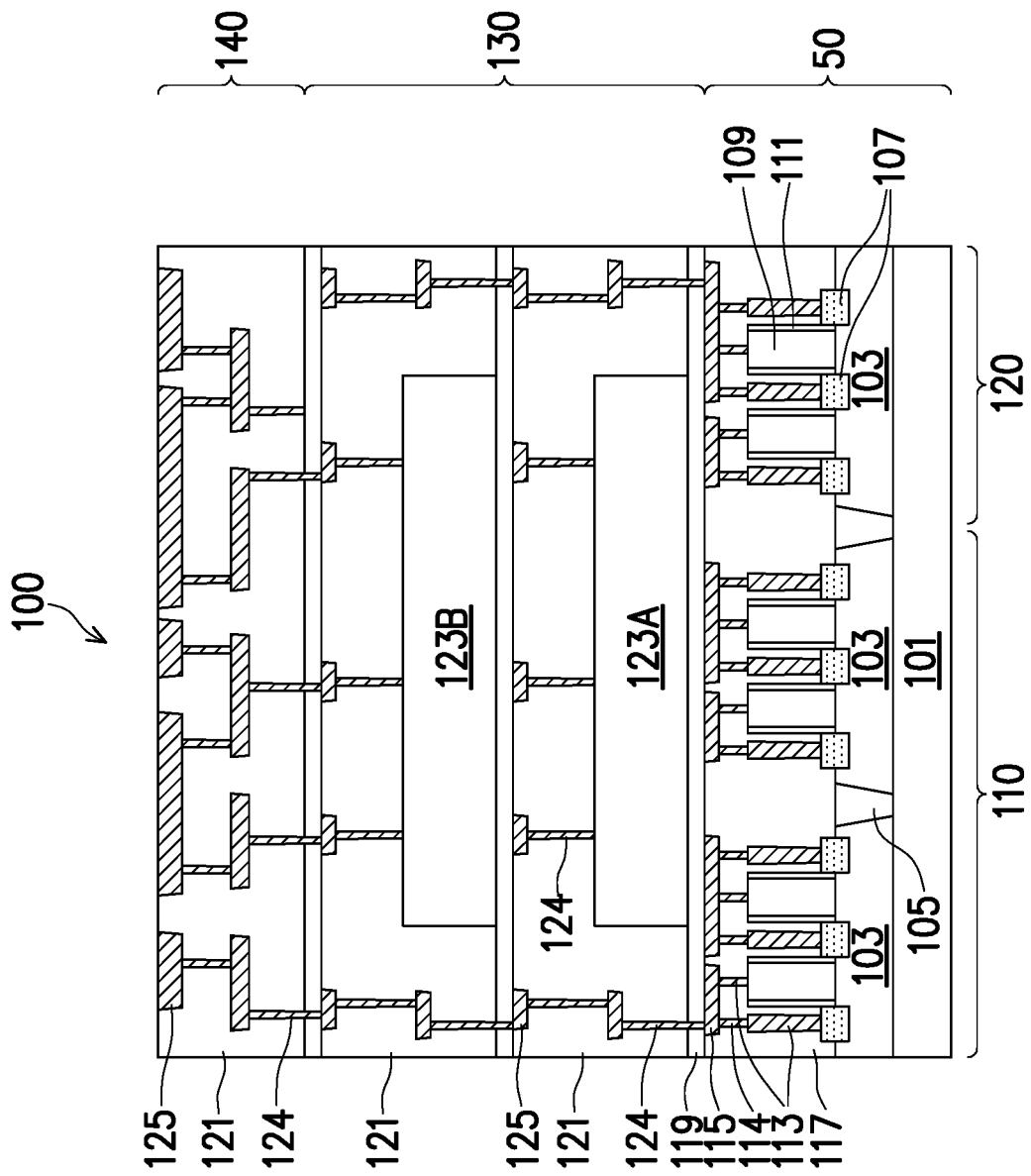
FIG. 1 illustrates a cross-sectional view of a semiconductor device with integrated memory devices, in an embodiment.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Throughout the discussion herein, unless otherwise specified, the same or similar reference numeral in different figures refers to the same or similar element formed by a same or similar process using a same or similar material(s).

In some embodiments, a method of forming a ferroelectric random access memory (FeRAM) device includes forming a first layer stack and a second layer stack successively over a substrate, where the first layer stack and the second layer stack have a same layered structure that includes a layer of a first electrically conductive material over a layer of a first dielectric material, where the first layer stack extends beyond lateral extents of the second layer stack. The method further includes forming a trench that extends through the first layer stack and the second layer stack, lining sidewalls and a bottom of the trench with a ferroelectric material, conformally forming a channel material in the trench over the ferroelectric material, filling the trench with a second dielectric material, forming a first opening and a second opening in the second dielectric material, and filling the first opening and the second opening with a second electrically conductive material.

FIG. 1 illustrates a cross-sectional view of a semiconductor device 100 with integrated memory devices 123 (e.g., 123A and 123B), in an embodiment. The semiconductor device 100 is a fin-field effect transistor (FinFET) device with three-dimensional (3D) ferroelectric random access memory (FeRAM) devices 123 integrated in the back-end-of-line (BEOL) processing of semiconductor manufacturing, in the illustrated embodiment. To avoid clutter, details of the memory devices 123 are not shown in FIG. 1, but are illustrated in subsequent figures hereinafter.

As illustrated in FIG. 1, the semiconductor device 100 includes different regions for forming different types of circuits. For example, the semiconductor device 100 may include a first region 11o for forming logic circuits, and may include a second region 120 for forming, e.g., peripheral circuits, input/output (I/O) circuits, electrostatic discharge (ESD) circuits, and/or analog circuits. Other regions for forming other types of circuits are possible and are fully intended to be included within the scope of the present disclosure.

The semiconductor device 100 includes a substrate 101. The substrate 101 may be a bulk substrate, such as a silicon substrate, doped or undoped, or an active layer of a semiconductor-on-insulator (SOI) substrate. The substrate 101 may include other semiconductor materials, such as germanium; a compound semiconductor including silicon carbide, gallium arsenic, gallium phosphide, gallium nitride, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

Electrical components, such as transistors, resistors, capacitors, inductors, diodes, or the like, are formed in or on the substrate 101 in the front-end-of-line (FEOL) processing of semiconductor manufacturing. In the example of FIG. 1, semiconductor fins 103 (also referred to as fins) are formed protruding above the substrate 101. Isolation regions 105, such as shallow-trench isolation (STI) regions, are formed between or around the semiconductor fins 103. Gate electrodes 109 are formed over the semiconductor fins 103. Gate spacers 111 are formed along sidewalls of the gate electrodes 109. Source/drain regions 107, such as epitaxial source/drain regions, are formed on opposing sides of the gate electrodes 109. Contacts 113, such as gate contacts and source/drain contacts, are formed over and electrically coupled to respective underlying electrically conductive features (e.g., gate electrodes 109 or source/drain regions 107). One or more dielectric layers 117, such as an inter-layer dielectric (ILD) layer, is formed over the substrate 101 and around the semiconductor fins 103 and the gate electrodes 109. Other electrically conductive features, such as interconnect structures comprising conductive lines 115 and vias 114, may also be formed in the one or more dielectric layers 117. The FinFETs in FIG. 1 may be formed by any suitable method known or used in the art, details are not repeated here. For ease of discussion herein, the substrate 101, the electrical components (e.g., FinFETs) formed in/or the substrate 101, the contacts 113, conductive features 115/114, and the one or more dielectric layers 117 are collectively referred to as substrate 50.

Still referring to FIG. 1, a dielectric layer 119, which may be an etch stop layer (ESL), is formed over the one or more dielectric layers 117. In an embodiment, the dielectric layer 119 is formed of silicon nitride using plasma-enhanced physical vapor deposition (PECVD), although other dielectric materials such as nitride, carbide, combinations thereof, or the like, and alternative techniques of forming the dielectric layer 119, such as low-pressure chemical vapor deposition (LPCVD), PVD, or the like, could alternatively be used. In some embodiments, the dielectric layer 119 is omitted. Next, a dielectric layer 121 is formed over the dielectric layer 119. The dielectric layer 121 may be any suitable dielectric material, such as silicon oxide, silicon nitride, or the like, formed by a suitable method, such as PVD, CVD, or the like. One or more memory device 123A, each of which includes a plurality of memory cells, are formed in the dielectric layer 121 and coupled to electrically conductive features (e.g., vias 124 and conductive lines 125) in the dielectric layer 121. Various embodiments of the memory devices 123A or 123B in FIG. 1 (e.g., 3D FeRAM devices 200, 200A, and 200B) are discussed hereinafter in details.

FIG. 1 further illustrates a second layer of memory devices 123B formed over the memory devices 123A. The memory devices 123A and 123B may have a same or similar structure, and may be collectively referred to as memory devices 123. The example of FIG. 1 illustrates two layers of memory devices 123 as a non-limiting example. Other numbers of layers of memory devices 123, such as one layer, three layers, or more, are also possible and are fully intended to be included within the scope of the present disclosure. The one or more layers of memory device 123 are formed in a memory region 130 of the semiconductor device 100, and may be formed in the back-end-of-line (BEOL) processing of semiconductor manufacturing. The memory devices 123 may be formed in the BEOL processing at any suitable locations within the semiconductor device 100, such as over (e.g., directly over) the first region 11o, over the second region 120, or over a plurality of regions.

In the example of FIG. 1, the memory devices 123 occupy some, but not all, of the areas of the memory region 130 of the semiconductor device 100, because other features, such as conductive lines 125 and vias 124, may be formed in other areas of the memory region 130 for connection to conductive features over and below the memory region 130. In some embodiments, to form the memory devices 123A or 123B, a mask layer, such as a patterned photoresist layer, is formed to cover some areas of the memory region 130, while the memory devices 123A or 123B are formed in other areas of the memory region 130 exposed by the mask layer. After the memory devices 123 are formed, the mask layer is then removed.

Still referring to FIG. 1, after the memory region 130 is formed, an interconnect structure 140, which includes dielectric layer 121 and electrically conductive features (e.g., vias 124 and conductive lines 125) in the dielectric layer 121, is formed over the memory region 130. The interconnect structure 140 may electrically connect the electrical components formed in/on the substrate 101 to form functional circuits. The interconnect structure 140 may also electrically couple the memory devices 123 to the components formed in/on the substrate 101, and/or couple the memory devices 123 to conductive pads formed over the interconnect structure 140 for connection with an external circuit or an external device. Formation of interconnect structure is known in the art, thus details are not repeated here.

In some embodiments, the memory devices 123 are electrically coupled to the electrical components (e.g., transistors) formed on the substrate 50, e.g., by the vias 124 and conductive lines 125, and are controlled or accessed (e.g., written to or read from) by functional circuits of the semiconductor device 100, in some embodiments. In addition, or alternatively, the memory devices 123 are electrically coupled to conductive pads formed over a top metal layer of the interconnect structure 140, in which case the memory devices 123 may be controlled or accessed by an external circuit (e.g., another semiconductor device) directly without involvement of the functional circuits of the semiconductor device 100, in some embodiments. Although additional metal layers (e.g., the interconnect structure 140) are formed over the memory devices 123 in the example of FIG. 1, the memory devices 123 may be formed in a top (e.g., topmost) metal layer of the semiconductor device 100, these and other variations are fully intended to be included within the scope of the present disclosure.

FIGS. 2A, 2B, 3A, 3B, 4-7, 8A, 8B, 8C, 8D, 8E, 9, 10A, and 10B illustrate various views (e.g., perspective view, cross-sectional view, and/or top view) of a three-dimensional (3D) ferroelectric random access memory (FeRAM) device 200 at various stages of manufacturing, in an embodiment. For ease of discussion, a 3D FeRAM device may also be referred to as a 3D memory device, or simply a memory device in the discussion herein. The 3D memory device 200 is a three-dimensional memory device with a ferroelectric material. The 3D memory device 200 may be used as the memory device 123A and/or 123B in FIG. 1. Note that for simplicity, not all features of the 3D memory device 200 are illustrated in the figures.

Figure 2A:
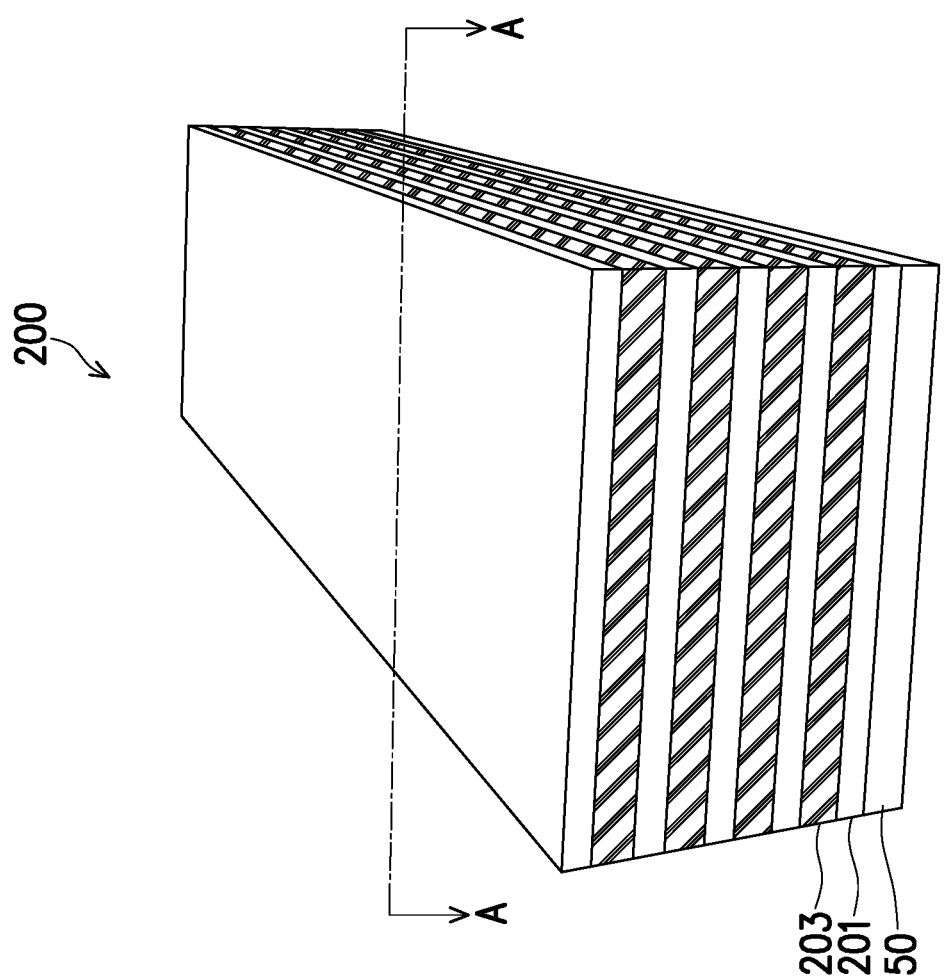
Figure 2B:
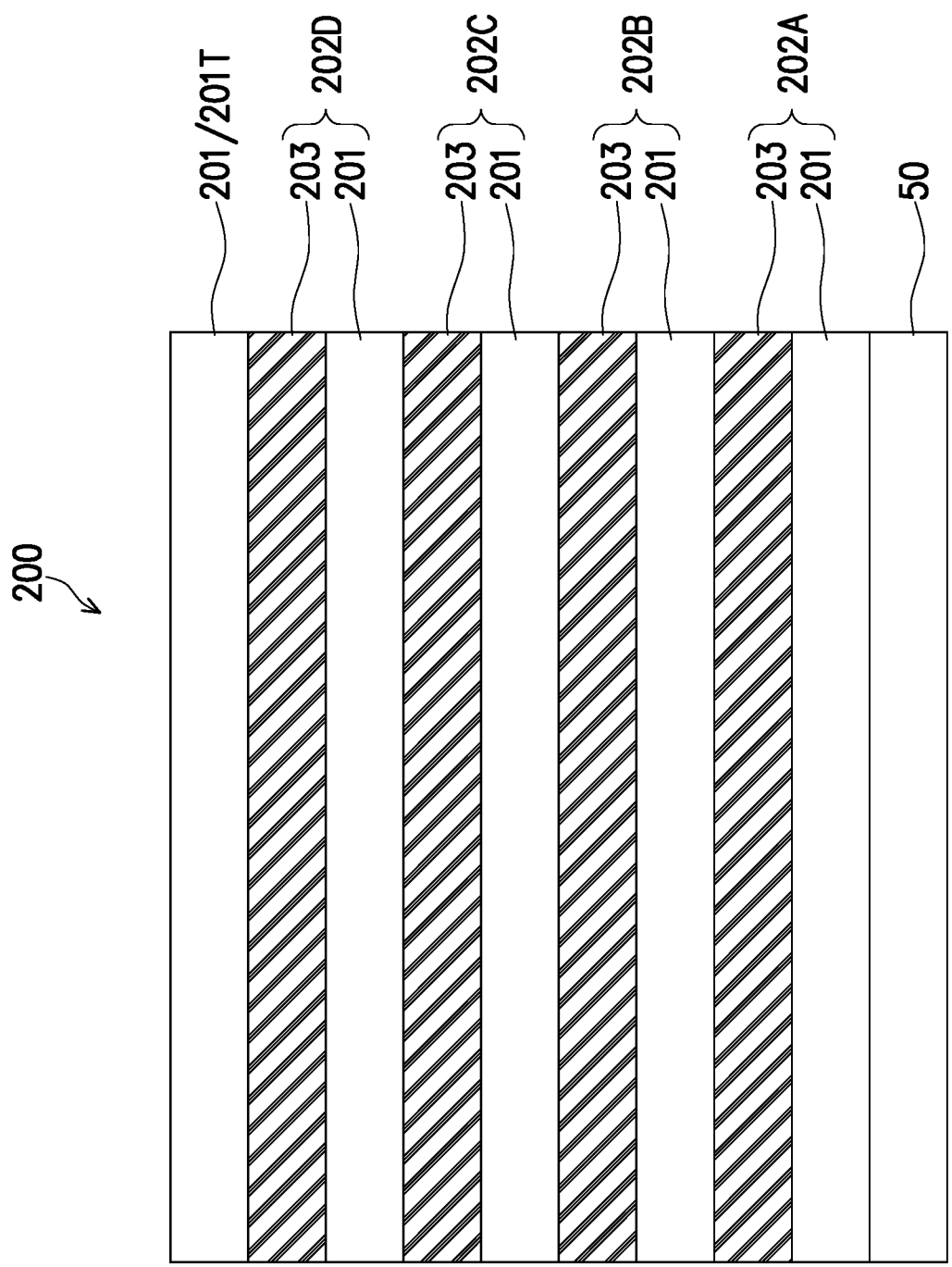

Referring now to FIG. 2A, which shows a perspective view of the memory device 200 at an early stage of fabrication. FIG. 2B illustrates the cross-sectional view of the memory device 200 of FIG. 2A along cross-section A-A. As illustrated in FIGS. 2A and 2B, layer stacks 202A, 202B, 202C, and 202D are formed successively over the substrate 50. The layer stacks 202A, 202B, 202C, and 202D may be collectively referred to as layer stacks 202 herein. The layer stacks 202A, 202B, 202C, and 202D have a same layered structure, in the illustrated embodiments. For example, each of the layer stacks 202 includes a dielectric layer 201, and an electrically conductive layer 203 over the dielectric layer 201. Note that the substrate 50 is illustrated in FIGS. 2A and 2B to show that the memory device 200 is formed over the substrate 50, and the substrate 50 may not be considered part of the memory device 200. For simplicity, the substrate 50 may not be illustrated in subsequent figures.

In some embodiments, to form the layer stack 202A, the dielectric layer 201 is first formed by depositing a suitable dielectric material, such as silicon oxide, silicon nitride, or the like, using a suitable deposition method, such as PVD, CVD, atomic layer deposition (ALD), or the like. Next, the electrically conductive layer 203 is formed over the dielectric layer 201. In some embodiments, the electrically conductive layer 203 is formed of an electrically conductive material, such as a metal or metal-containing material. Examples materials for the electrically conductive layer 203 include Al, Ti, TiN, TaN, Co, Ag, Au, Cu, Ni, Cr, Hf, Ru, W, Pt, or the like. The electrically conductive layer 203 may be formed by, e.g., PVD, CVD, ALD, combinations thereof, or the like.

After the layer stack 202A is formed, the process to form the layer stack 202A may be repeated to form the layer stacks 202B, 202C, and 202D successively over the layer stack 202A, as illustrated in FIG. 1. After the layer stacks 202A, 202B, 202C, and 202D are formed, a dielectric layer 201T is formed over the topmost layer stack, which is the layer stack 202D in the illustrated embodiments. In an example embodiment, the dielectric layer 201T is formed of a same dielectric material as the dielectric layer 201 of the layer stacks 202, thus may also be referred to as a dielectric layer 201 in subsequent discussion.

Figure 3A:
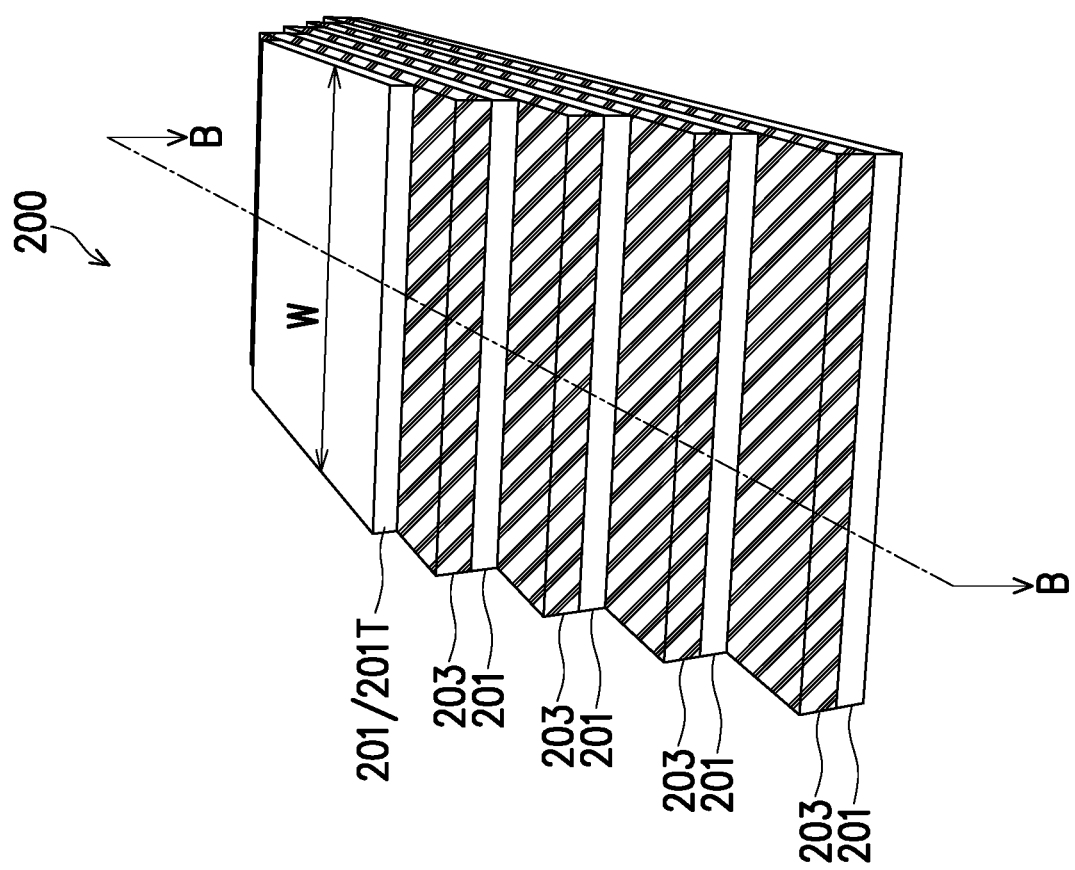
Figure 3B:
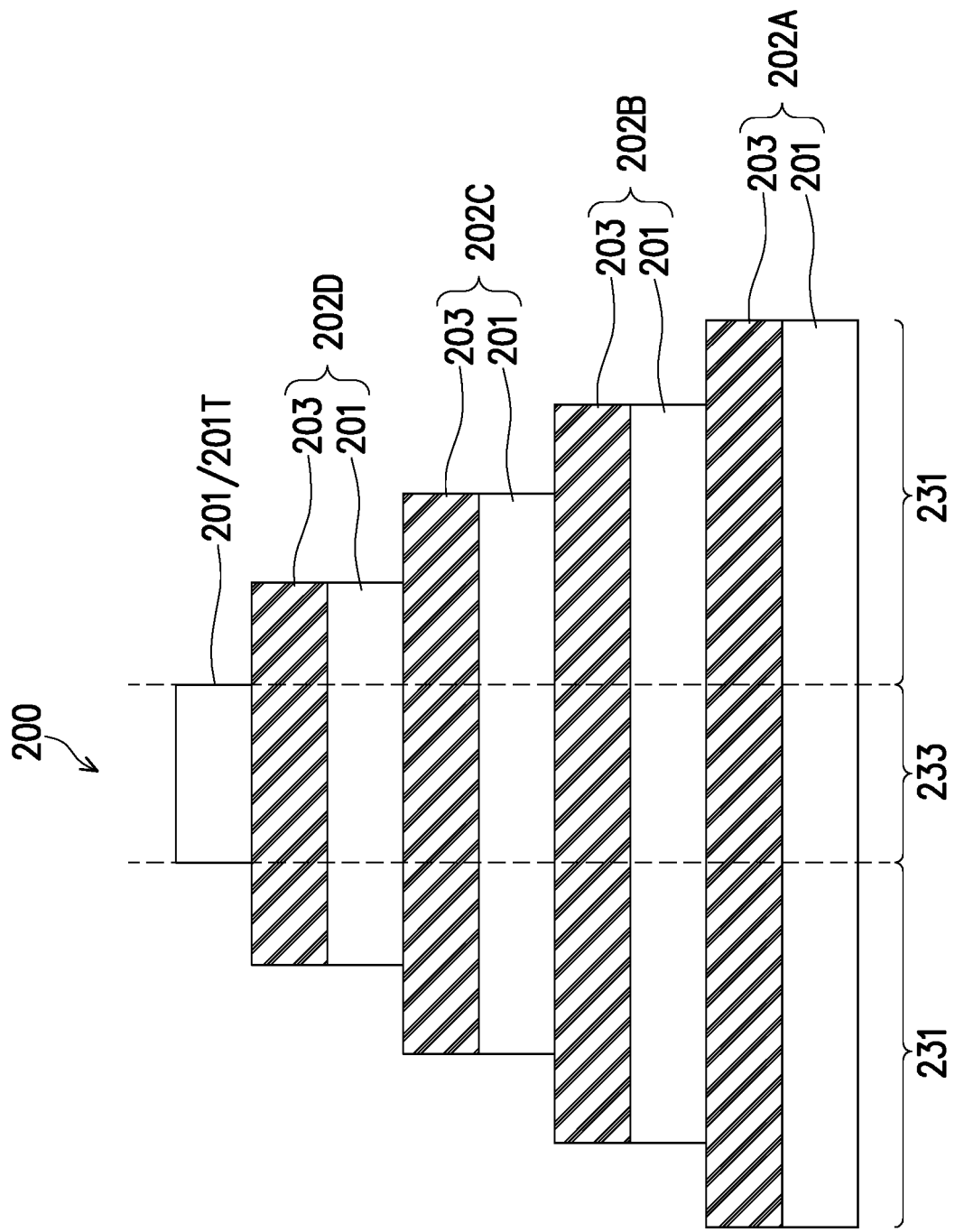

Next, as illustrated in FIGS. 3A and 3B, a plurality of etching processes are performed to pattern the layer stacks 202 and the dielectric layer 201T, such that staircase-shaped regions 231 are formed. In addition, the patterned dielectric layer 201T after the plurality of etching processes delimits a memory array region 233. For example, the memory array region 233 is defined by sidewalls of the patterned dielectric layer 201T. In subsequent processing, arrays of memory cells will be formed in the memory array region 233. FIG. 3A illustrates a perspective view of the memory device 200, and FIG. 3B illustrates a cross-sectional view of the memory device 200 in FIG. 3A along cross-section B-B.

As illustrated in FIGS. 3A and 3B, in the staircase-shaped regions 231, the layer stack 202D extends beyond lateral extents of the dielectric layer 201T, e.g., along the direction of the cross-section B-B. In addition, for any two vertically adjacent layer stacks (e.g., 202A and 202B), the lower layer stack (e.g., 202A), which is closer to the substrate 50, extends beyond lateral extents of the higher layer stack (e.g., 202B), which is further from the substrate 50, e.g., along the direction of the cross-section B-B. In other words, a width of a lower layer stack (e.g., 202A), measured along the direction of cross-section B-B between opposing sidewalls of the lower layer stack, is larger than a width of a higher layer stack (e.g., 202B) measured along the direction of cross-section B-B between opposing sidewalls of the higher layer stack. In addition, the width of the layer stack 202D is larger than a width of the dielectric layer 201T measured along the direction of the cross-section B-B. In the illustrated embodiment, the layer stacks 202 and the dielectric layer 201T have a same width W measured along a direction perpendicular to the cross-section B-B.

Note that in the discussion herein, a sidewall of the layer stack 202A, 202B, 202C, or 202D includes the corresponding sidewalls of all the constituent layers (e.g., 201 and 203) of that layer stack. For example, a sidewall of the layer stack 202A exposed by trench 206 (see FIG. 5) includes the corresponding sidewall of the dielectric layer 201 and the corresponding sidewall of the electrically conductive layer 203. In the illustrated embodiments, the etching process(es) performed on each of the layer stacks 202 to form the staircase-shaped regions 231 is anisotropic, and therefore, a sidewall of the dielectric layer 201 and a corresponding sidewall of the electrically conductive layer 203 in a same layer stack 202 (e.g., 202A, 202B, 202C, or 202D) are aligned along a same vertical plane.

Still referring to FIGS. 3A and 3B, in the staircase-shaped regions 231, portions of each layer stack 202 laterally distal from the memory array region 233 are removed. The higher (e.g., further from the substrate 50) is a layer stack 202, the greater is the width (e.g., measured along the direction of cross-section B-B) of the removed portions of the layer stack. As a result, for each layer stack 202, portions of the electrically conductive layer 203 laterally distal from the memory array region 233 are exposed by an overlying layer stack. The staircase-shaped region 231 thus provides easy access to the electrically conductive layer 203 of each layer stack 202, e.g., during subsequent processing to form contacts 227 (see FIG. 10B).

In some embodiments, to form the staircase-shaped region 231, a patterned photoresist with a first width (e.g., along the direction of cross-section B-B) is formed over the dielectric layer 201T, and a first anisotropic etching process is performed to pattern the dielectric layer 201T and to expose the layer stack 202D. In other words, the first anisotropic etching process stops when the upper surface of the electrically conductive layer 203 of the layer stack 202D is exposed. Next, the width of the patterned photoresist is reduced (e.g., by a photoresist trimming process), and a second anisotropic etching process is performed to pattern the layer stack 202D and to expose the layer stack 202C. In other words, the second anisotropic etching process stops when the upper surface of the electrically conductive layer 203 of the layer stack 202C is exposed. The second anisotropic etching process also removes exposed portions of the dielectric layer 201T, and therefore, reduces the width of the dielectric layer 201T. The above described processes repeats, with the width of the patterned photoresist being reduced for each additional anisotropic etching process, until the upper surface of the electrically conductive layer 203 of the layer stack 202A is exposed by the patterned layer stack 202B. The patterned photoresist may then be removed, e.g., by an ashing or stripping process. In some embodiments, the anisotropic etching process (e.g., a dry etch process such as plasma etch process) is performed using a gas source comprising $CF_4$, $C_4F_8$, $BCl_3$, $Cl_2$, $CCl_4$, $SiCl_4$, $CH_2F_2$, the like, or combination thereof.

In the present disclosure, the staircase-shaped regions 231 are formed early in the fabrication process, before memory cells are formed in the memory array region 233. Such a fabrication process is referred to as a staircase-first process, which is different from a staircase-last process where the staircase-shaped region is formed after the memory cells are formed. By forming the staircase-shaped regions 231 early, the anisotropic etching process to form the staircase-shaped regions 231 has less materials (e.g., 201 and 203) to etch, and therefore, it is easier to select the etchant (e.g., the etching gas) that can achieve target etching selectivity and target etching profiles (e.g., sidewall profile after etching). As a result of the staircase-first process, issues with the staircase-last process, such as multiple-film etching challenges (e.g., due to more materials to etch, such as the ferroelectric material 213, the channel material 207, and additional dielectric materials 209/212) and defects (e.g., such as staircase pattern fail induced by nonvolatile by-products of the etching process), are reduced or avoided. Therefore, the disclosed staircase-first process achieves better process control and etching profile, while reducing defects and improving production yield and device performance.

Figure 4:
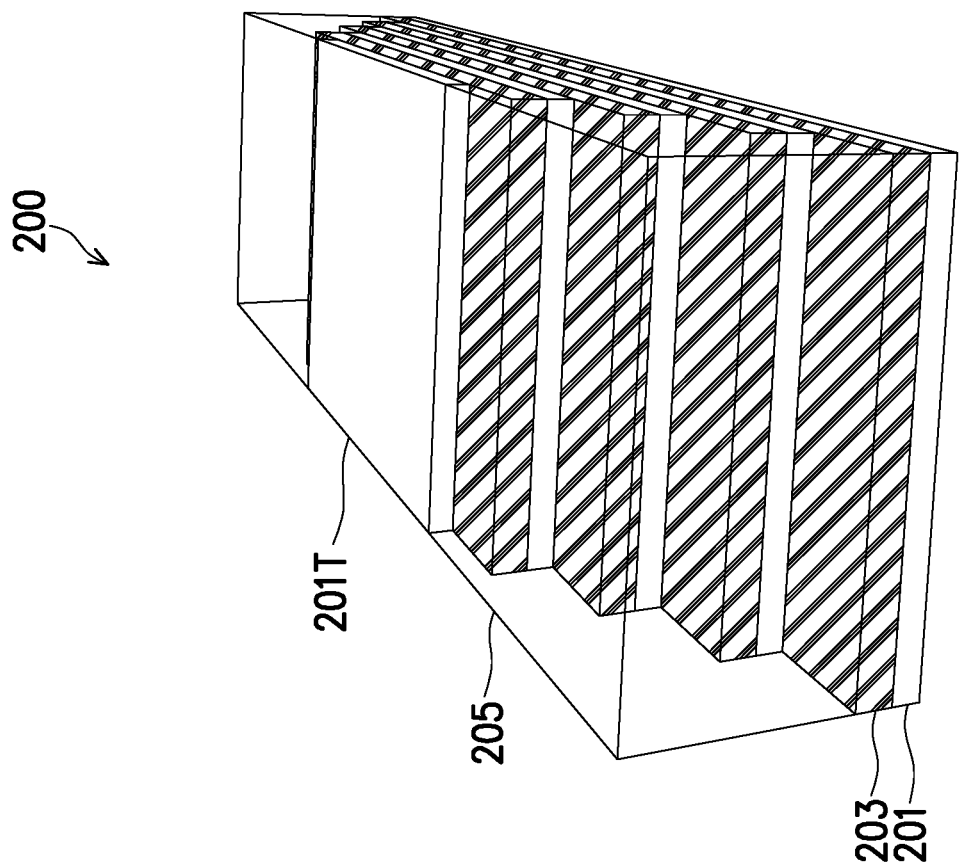

Next, in FIG. 4, a dielectric material 205 is formed over the dielectric layer 201T and over the layer stacks 202. A planarization process, such as chemical and mechanical planarization (CMP), may be performed, such that the upper surface of the dielectric material 205 is level with the upper surface of the dielectric layer 201T. In some embodiments, the dielectric material 205 is formed by depositing a suitable dielectric material, such as silicon oxide, silicon nitride, or the like, using a suitable deposition method, such as PVD, CVD, or the like.

Figure 5:
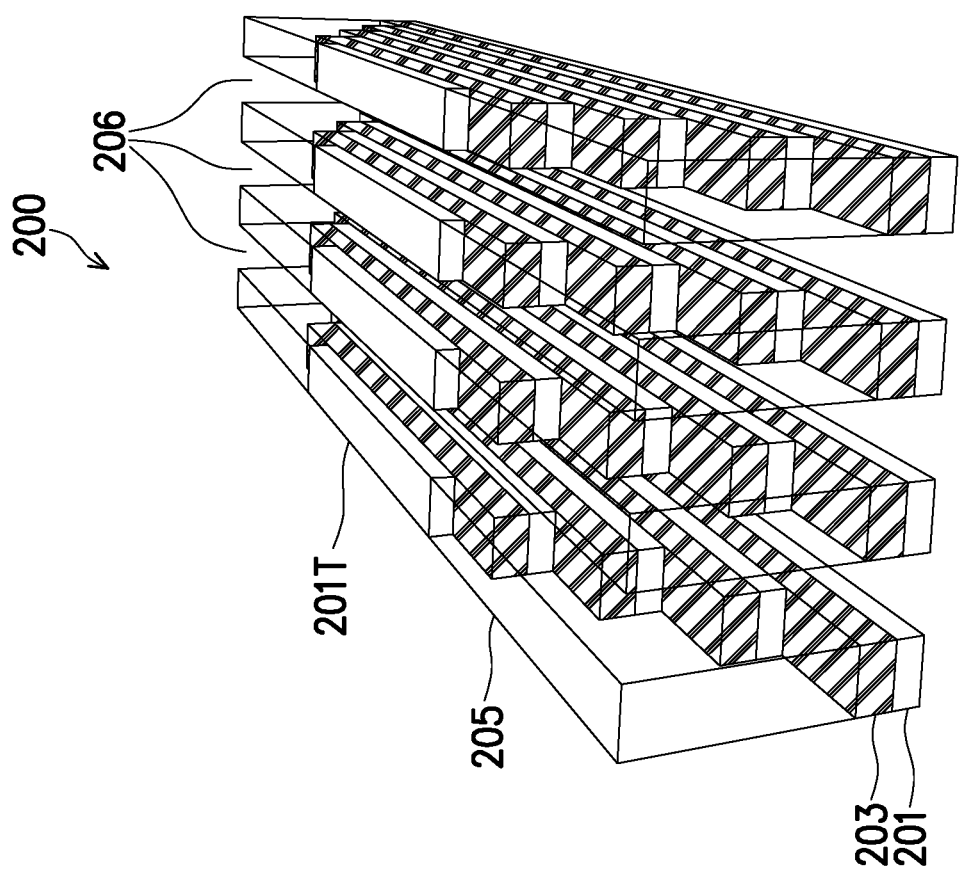

Next, in FIG. 5, trenches 206 are formed. The trenches 206 (may also be referred to as openings, recesses, or slots) are formed to extend through the dielectric layer 201T, the dielectric material 205, and (the remaining portions of) the layer stacks 202. In the example of FIG. 5, longitudinal axes of the trenches 206 extend along the direction of cross-section B-B (see FIG. 3A). The trenches 206 extends continuously between opposing sidewalls of the layer stack 202A, such that the trenches 206 cut through the structure of FIG. 4, and separate the structure of FIG. 4 into a plurality of slices that are separate (e.g., spaced apart) from each other.

Figure 6:
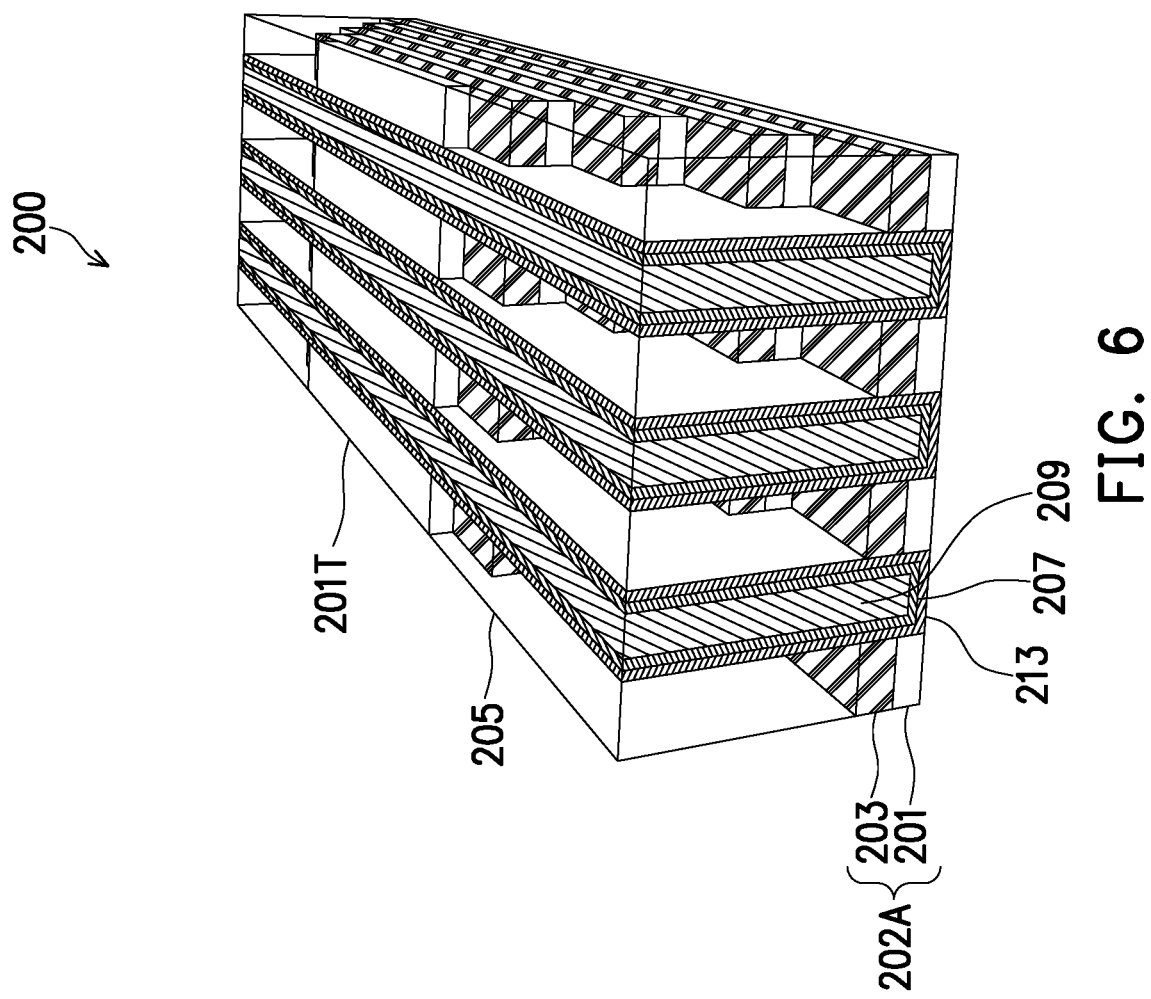

Next, in FIG. 6, a ferroelectric material 213 is formed (e.g., conformally) in the trenches 206 along sidewalls and bottoms of the trenches 206, and a channel material 207 is formed (e.g., conformally) over the ferroelectric material 213. A dielectric material 209 is then formed over the channel material 207 to fill the trenches 206. A planarization process, such as CMP, may be performed to remove excess portions of the ferroelectric material 213, excess portions of the channel material 207, and excess portions of the dielectric material 209 from the upper surface of the dielectric layer 201T and from the upper surface of the dielectric material 205. The remaining ferroelectric material 213 in the trenches 206 may be referred to as ferroelectric film 213, and the remaining channel material 207 in the trenches 206 may be referred to as channel layer 207.

In some embodiments, the ferroelectric material 213 comprises $BaTiO_3$, $PbTiO_3$, $PbZrO_3$, $LiNbO_3$, $NaNbO_3$, $KNbO_3$, $KTaO_3$, $BiScO_3$, $BiFeO_3$, $Hf_{1-x}Er_xO$, $Hf_{1-x}La_xO$, $Hf Y_xO$, $Hf_{1-x}Gd_xO$, $Hf_{1-x}Al_xO$, $Hf_{1-x}Zr_xO$, $Hf_{1-x}Ti_xO$, $Hf_{1-x}Ta_xO$, AlScN, the like, combinations thereof, or multi layers thereof, and may be formed by a suitable formation method such as PVD, CVD, ALD, or the like. In some embodiments, the channel material 207 is a semiconductive material, such as amorphous-silicon (a-Si), polysilicon (poly-Si), a semi-conductive oxide (e.g., indium gallium zinc oxide (IGZO), indium zinc oxide (IZO), zinc oxide (ZnO), indium tin oxide (ITO), or indium tungsten oxide (IWO)), or the like. The channel layer 207 may be formed by, e.g., PVD, CVD, ALD, combinations thereof, or the like. In some embodiments, the dielectric material 209 is formed by depositing a suitable dielectric material, such as silicon oxide, silicon nitride, or the like, using a suitable deposition method, such as PVD, CVD, ALD, or the like.

Figure 7:
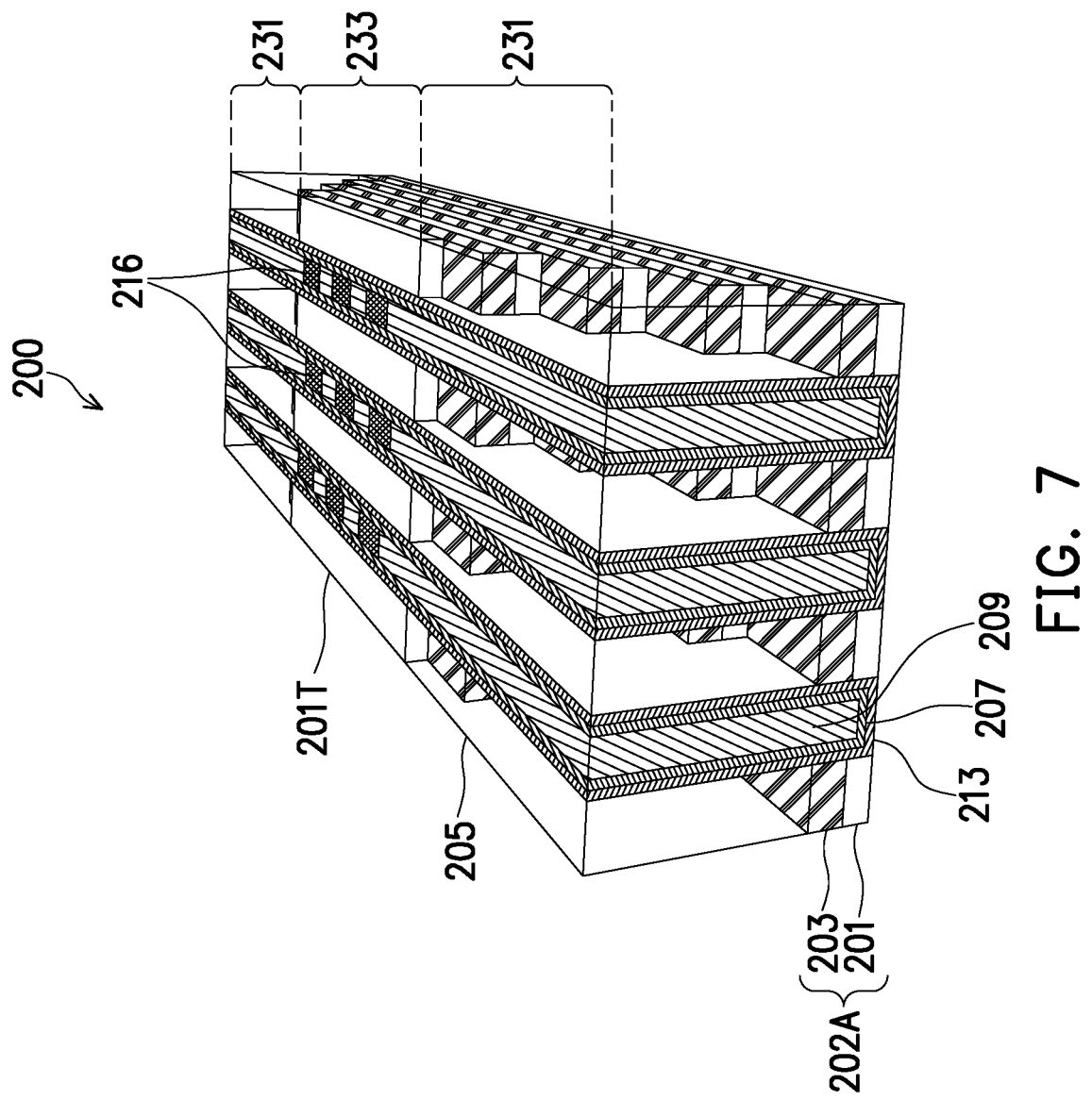

Next, in FIG. 7, conductive lines 216 are formed in the memory array region 233 and extend vertically through the dielectric layer 201T and the layer stacks 202. The conductive lines 216 are conductive columns (may also be referred to as metal columns, or metal lines) that extend vertically (e.g., perpendicular to the upper surface of the substrate 50) through the memory array region 233 and are electrically coupled to the electrically conductive layers 203 of the layer stacks 202A, 202B, 202C, and 202D. To form the conductive lines 216, openings are formed (e.g., by photolithography and etching techniques) in the dielectric material 209 in the memory array region 233, which openings extend from the upper surface of the dielectric layer 201T to the lower surface of the layer stack 202A facing the substrate 50. Next, an electrically conductive material(s), such as Al, Ti, TiN, TaN, Co, Ag, Au, Cu, Ni, Cr, Hf, Ru, W, Pt, or the like, is formed to fill the openings, thereby forming the conductive lines 216.

Figure 8A:
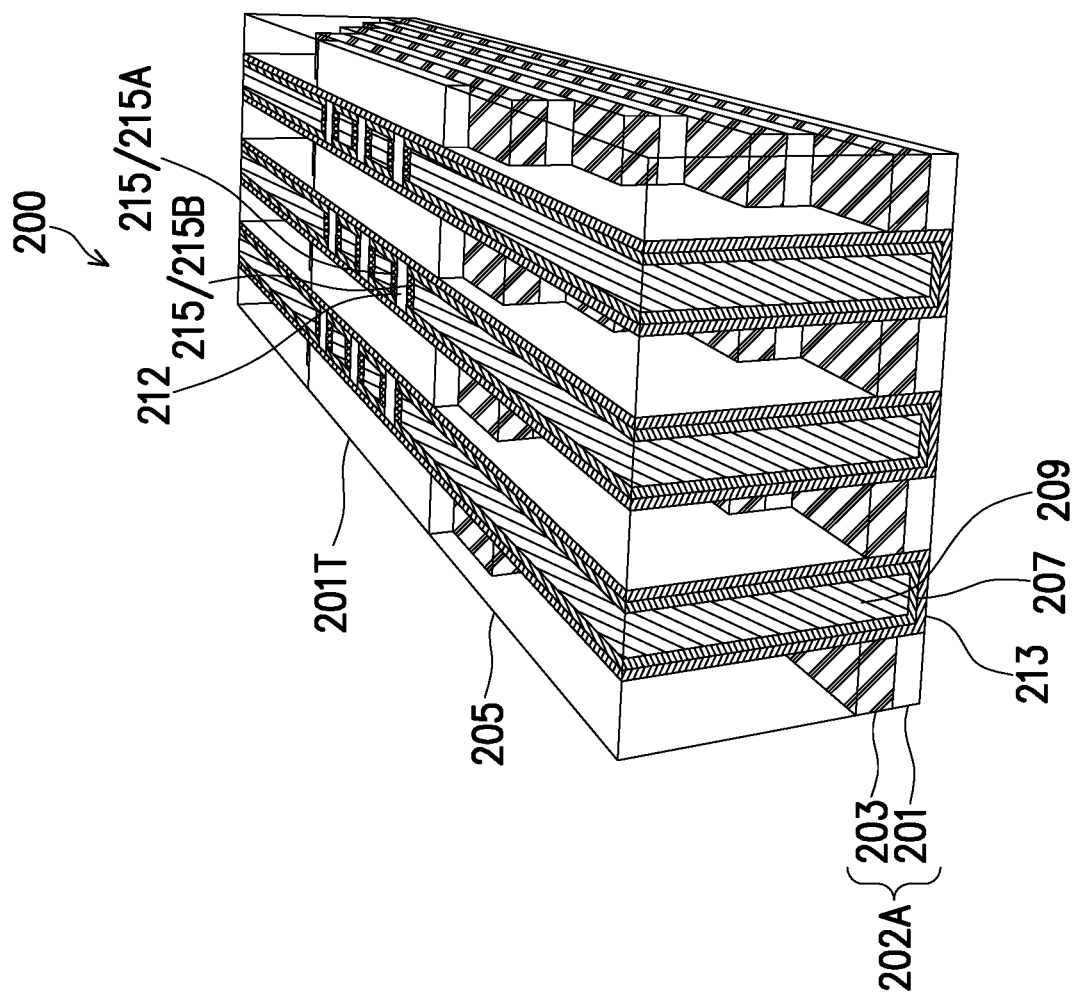

Next, in FIG. 8A, an isolation region 212 is formed in each of the conductive lines 216 to separate each conductive line 216 into a pair of conductive lines 215A and 215B. For ease of discussion, the conductive lines 215A and 215B may be collectively referred to as conductive lines 215. The isolation regions 212 may be formed by performing an anisotropic etching process to form an opening in each of the conductive lines 216, then fill the opening with a dielectric material, such as silicon oxide, silicon nitride, or the like, using a suitable formation method such as CVD, PVD, ALD, or the like.

Figure 8B:
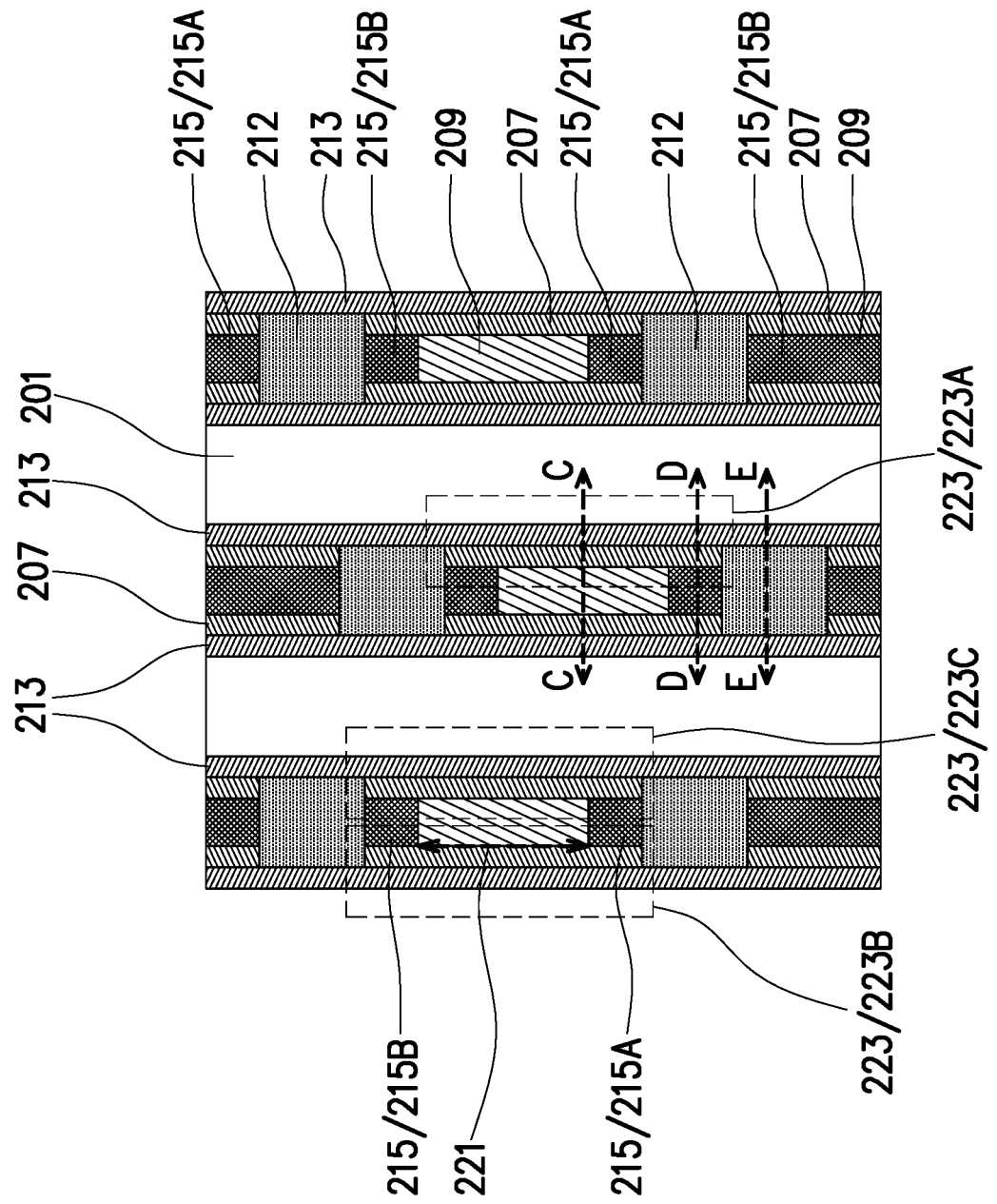
Figure 8E:
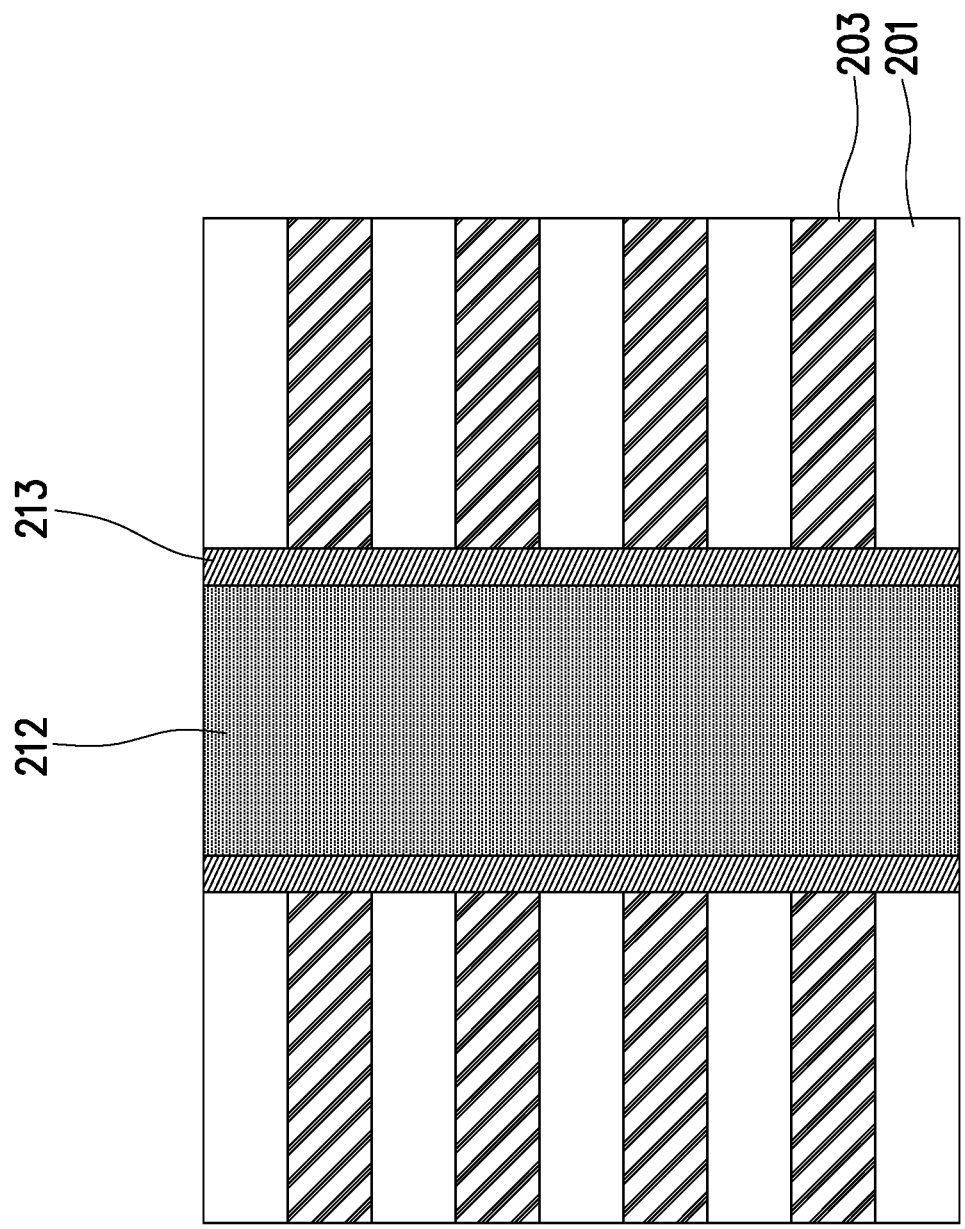

FIG. 8B illustrates a top view of a portion of the memory array region 233 of the memory device 200 of FIG. 8A. FIGS. 8C, 8D, and 8E illustrate cross-sectional views of a portion of the memory device 200 in FIG. 8B along cross-sections C-C, D-D, and E-E, respectively. As illustrated in the top view of FIG. 8B, each isolation region 212 extends continuously from a first sidewall of the ferroelectric material 213 to a second sidewall of the ferroelectric material 213 facing the first sidewall of the ferroelectric material. In other words, a width of the isolation region 212, measured along the horizontal direction of FIG. 8B, is the same as a distance between inner sidewalls of the ferroelectric material 213 in a trench and facing each other. In addition, each of the conductive lines 215 extends continuously from a first sidewall of the channel material 207 to a second sidewall of the channel material 207 facing the first sidewall of the channel material. In other words, a width of the conductive line 215, measured along the horizontal direction of FIG. 8B, is the same as a distance between inner sidewalls of the channel material 207 in a trench and facing each other.

In FIG. 8B, a few, but not all, of the memory cells 223 (e.g., 223A, 223B, 223C) formed in the memory array region are highlighted by dashed boxes. Memory cells 223 are also highlighted by dashed boxes in FIGS. 8C and 8D. As illustrated in FIGS. 8A-8E, each memory cell 223 is a transistor with an embedded ferroelectric film 213. Within each memory cell 223, the electrically conductive layer 203 (see, e.g., FIGS. 8C and 8D) functions as the gate electrode of the transistor, the conductive lines 215A and 215B function as the source/drain regions of the transistor, and the channel material 207 functions as the channel layer between the source/drain regions. The dashed line 221 in FIG. 8B (see also FIGS. 8C and 8D) illustrates the channel region formed in the channel material 207 during operation of the memory device 200, e.g., when a voltage is applied at the gate of the transistor and causes the transistor to be turned on. The electrical polarization direction of the ferroelectric film 213 in each memory cell 223 indicates the digital information (e.g., a "0" or "1") stored in the memory cell 223, and determines the threshold voltage of the transistor of the memory cell 223, more details are discussed hereinafter.

In the context of memory devices, the electrically conductive layer 203 (e.g., the gate electrode) in each memory cell 223 is referred to as the word line (WL) of the memory cell, the conductive lines 215A and 215B (e.g., the source/drain regions) may be referred to as the source line (SL) and the bit line (BL) of the memory cell. The source line may also be referred to as scan line.

As illustrated in FIG. 8A, each of the electrically conductive layers 203 (e.g., WL) of the memory device 200 electrically connects multiple memory cells formed along a same horizontal plane (e.g., at a same vertical distance from the substrate 50). In addition, as illustrated in FIGS. 8C-8D, each SL or BL 215 electrically connects multiple vertically stacked memory cells 223. Therefore, the disclosed 3D memory device 200 achieves efficient sharing of the WLs, BLs, and SLs among multiple memory cells 223, and the 3D structure of the memory cells 223 allows for multiple layers of the memory cells 223 to be stacked easily together to form high density memory arrays.

Figure 9:
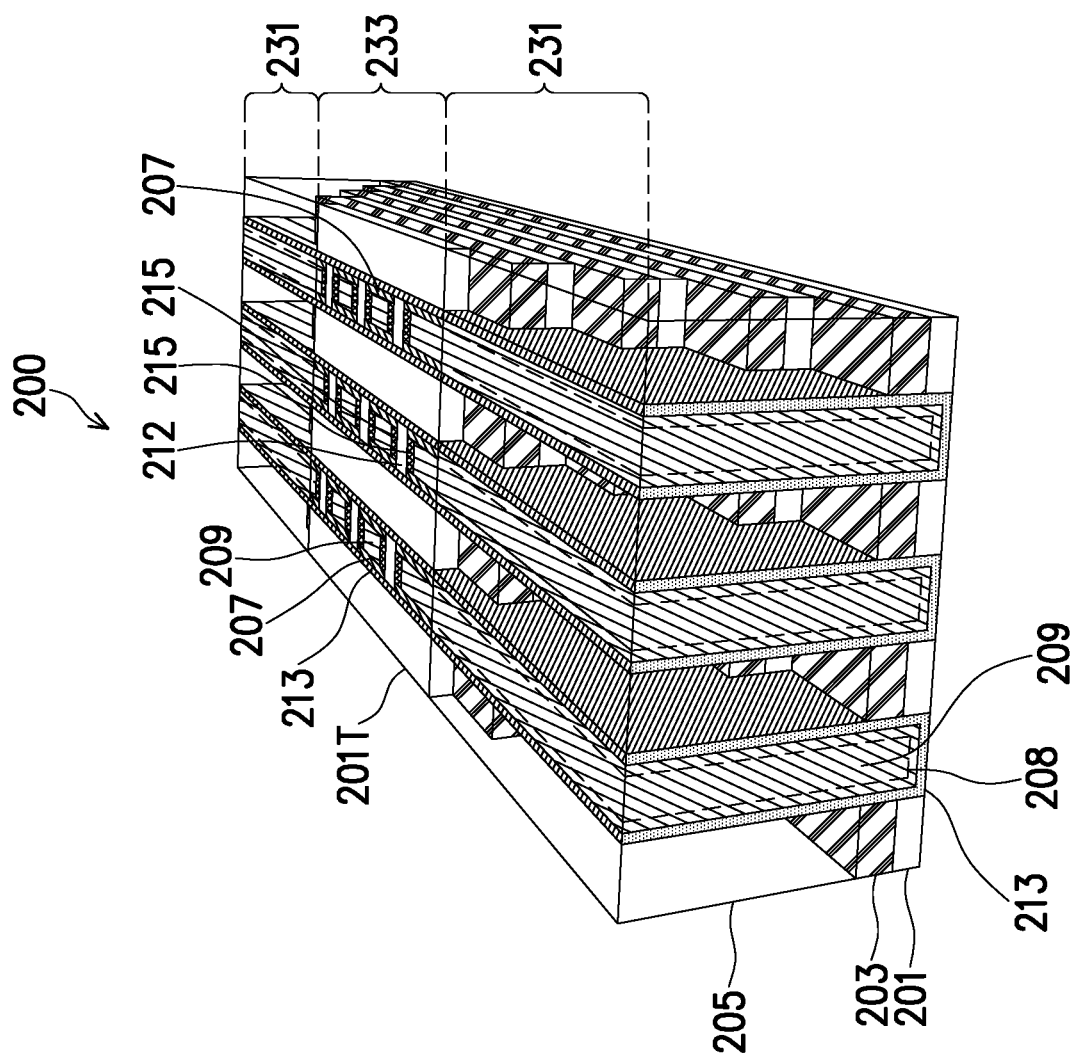

Next, in FIG. 9, the channel material 207 disposed in the staircase-shaped regions 231 is removed, and a dielectric material 208 is formed to fill the spaces left by the removed channel material 207. In some embodiments, to remove the channel material 207 in the staircase-shaped regions 231, a patterned mask layer (e.g., a patterned photoresist) is formed over the memory device 200 to cover the memory array region 233 and to expose the staircase-shaped regions 231. Next, an etching process using an etchant selective to (e.g., having a higher etching rate for) the channel material 207 is performed to selectively remove the exposed channel material 207. Next, the dielectric material 208 is formed to fill the space left by the removed portions of the channel material 207. The dielectric material 208 may be formed of a same or similar material as the dielectric material 205, thus details are not repeated here. The interface between the dielectric material 208 and the dielectric material 209 is indicated by dashed lines in FIG. 9, which may or may not be visible in the final product.

Figure 10A:
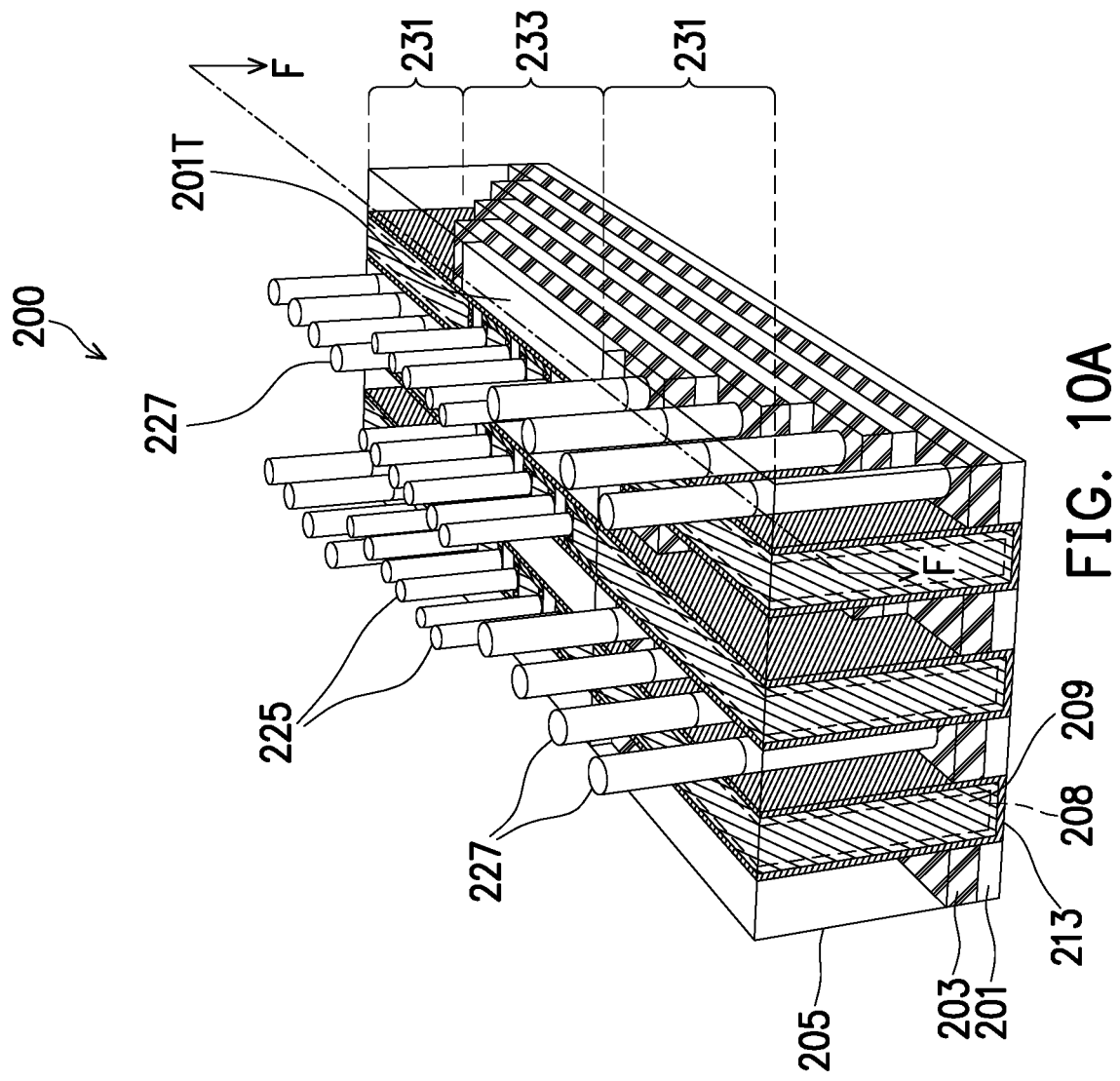
Figure 10B:
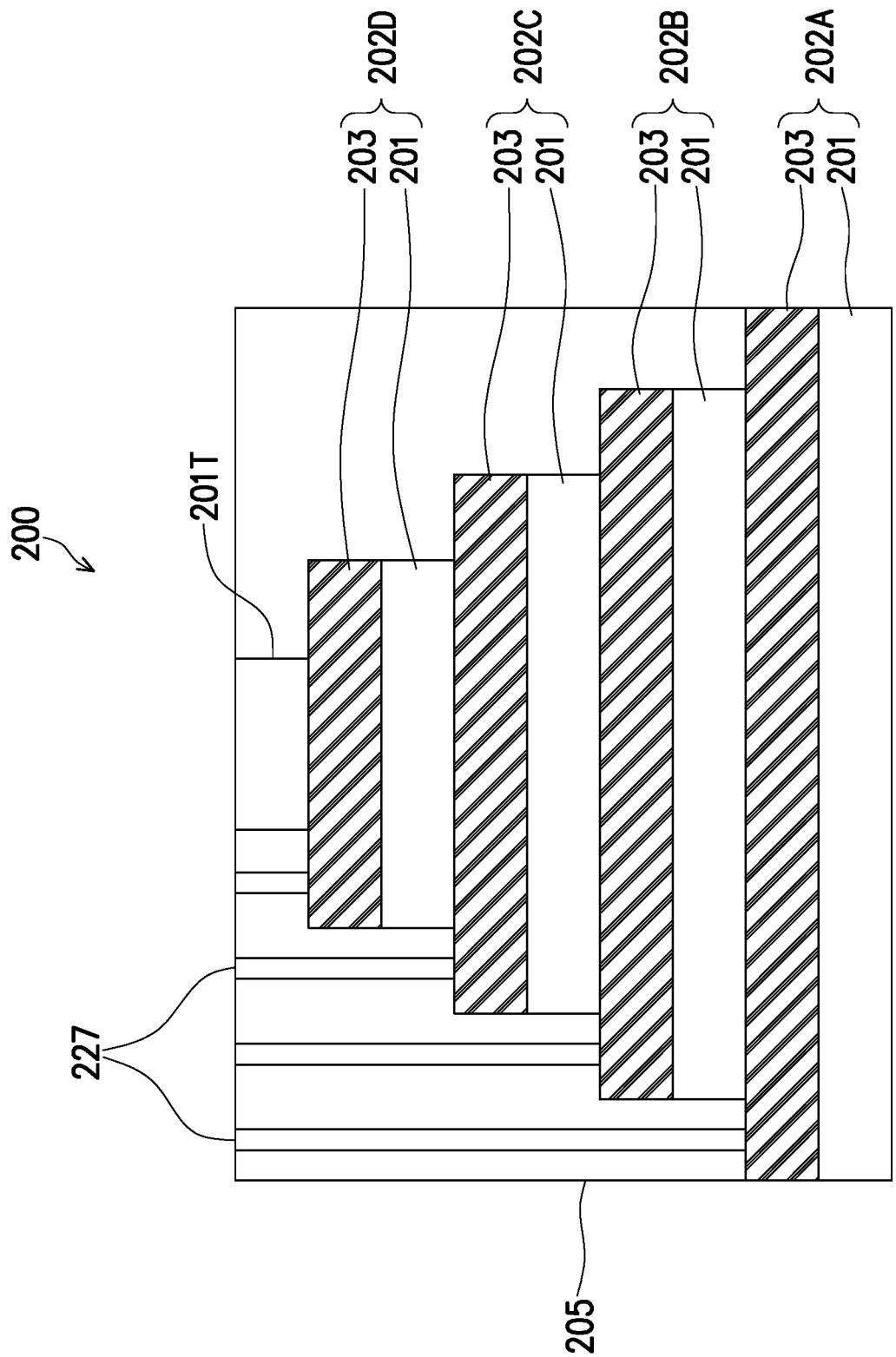

Next, in FIG. 10A, contacts 225 are formed over the memory array region 233 and are electrically coupled to respective SLs/BLs 215, and contacts 227 are formed over the staircase-shaped regions 231 and are electrically coupled to respective WLs 203. The contacts 227 may be formed by forming openings in the dielectric material 205 and filling the openings with an electrically conductive material. The contacts 225 may be formed by forming a dielectric layer (not shown) over the upper surface of the dielectric material 205, forming openings in the dielectric layer, and filling the openings with an electrically conductive material. FIG. 10B illustrates a cross-sectional view of the 3D memory device 200 of FIG. 10A along cross-section F-F. As illustrated in FIG. 10B, the contacts 227 are formed to extend through the dielectric material 205, and each contact 227 is electrically coupled to a respective electrically conductive layer 203 (e.g., WL 203). As illustrated in FIG. 10B, the staircase-shaped regions allow easy access of the WLs 203 for the contacts 227. The contacts 225 and 227 may be connected to, e.g., the underlying electrical components or circuits in the substrate 50 (see FIG. 1), and/or the interconnect structures 140, through, e.g., the vias 124 and the conductive lines 125.

Referring to FIGS. 8A-8E and 10A, to perform a write operation on a particular memory cell 223, a write voltage is applied across a portion of the ferroelectric material 213 within the memory cell 223. The write voltage may be applied, for example, by applying a first voltage to the gate electrode 203 of the memory cell 223 (through the contact 227), and applying a second voltage to the source/drain regions 215A/215B (through contacts 225). The voltage difference between the first voltage and the second voltage sets the polarization direction of the ferroelectric material 213. Depending on the polarization direction of the ferroelectric material 213, the threshold voltage VT of the corresponding transistor of the memory cell 223 can be switched from a low threshold voltage VL to a high threshold voltage VH, or vice versa. The threshold voltage value (VL or VH) of the transistor can be used to indicate a bit of "0" or a "1" stored in the memory cell.

To perform a read operation on the memory cell 223, a read voltage, which is a voltage between the low threshold voltage VL and the high threshold voltage VH, is applied to the gate electrode 203. Depending on the polarization direction of the ferroelectric material 213 (or the threshold voltage VT of the transistor), the transistor of the memory cells 223 may or may not be turned on. As a result, when a voltage is applied, e.g., between the source/drain regions 215A and 215B, an electrical current may or may not flow between the source/drain regions 215A and 215B. The electrical current may thus be detected to determine the digital bit stored in the memory cell.

Figure 11:
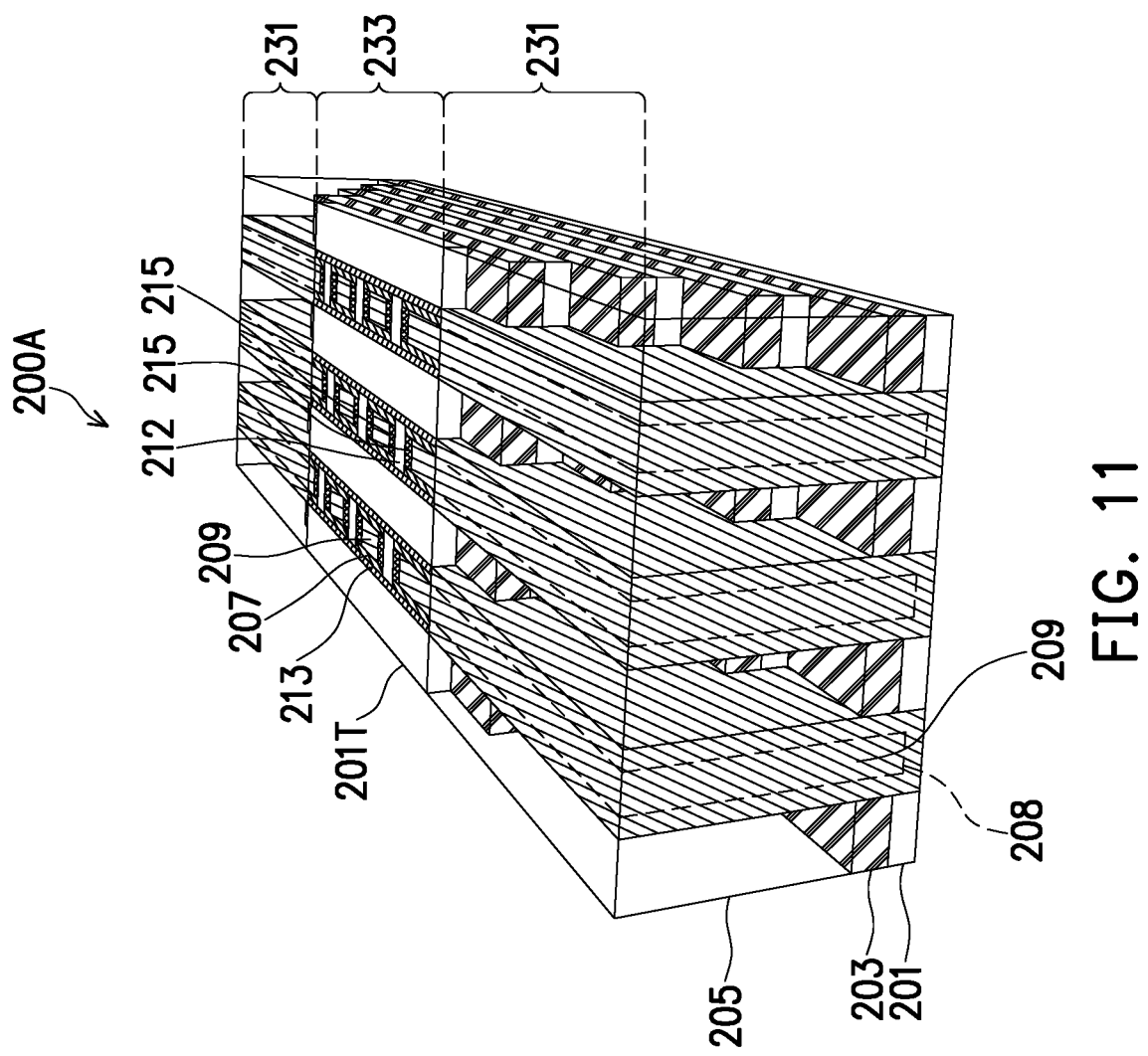
FIGS. 11 and 12 illustrate perspective views of a three-dimensional (3D) ferroelectric random access memory (FeRAM) device at various stages of manufacturing, in another embodiment.
Figure 12:
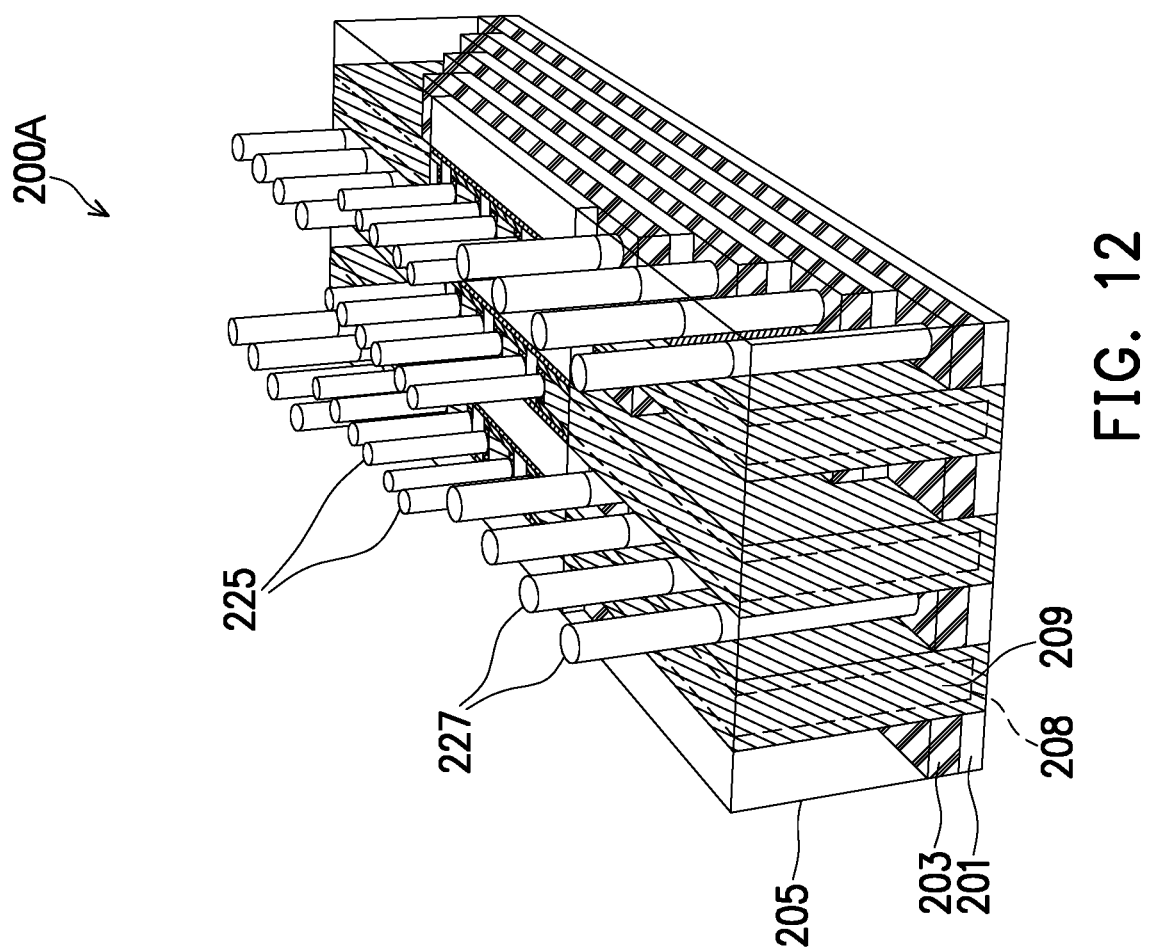
Figure 13:
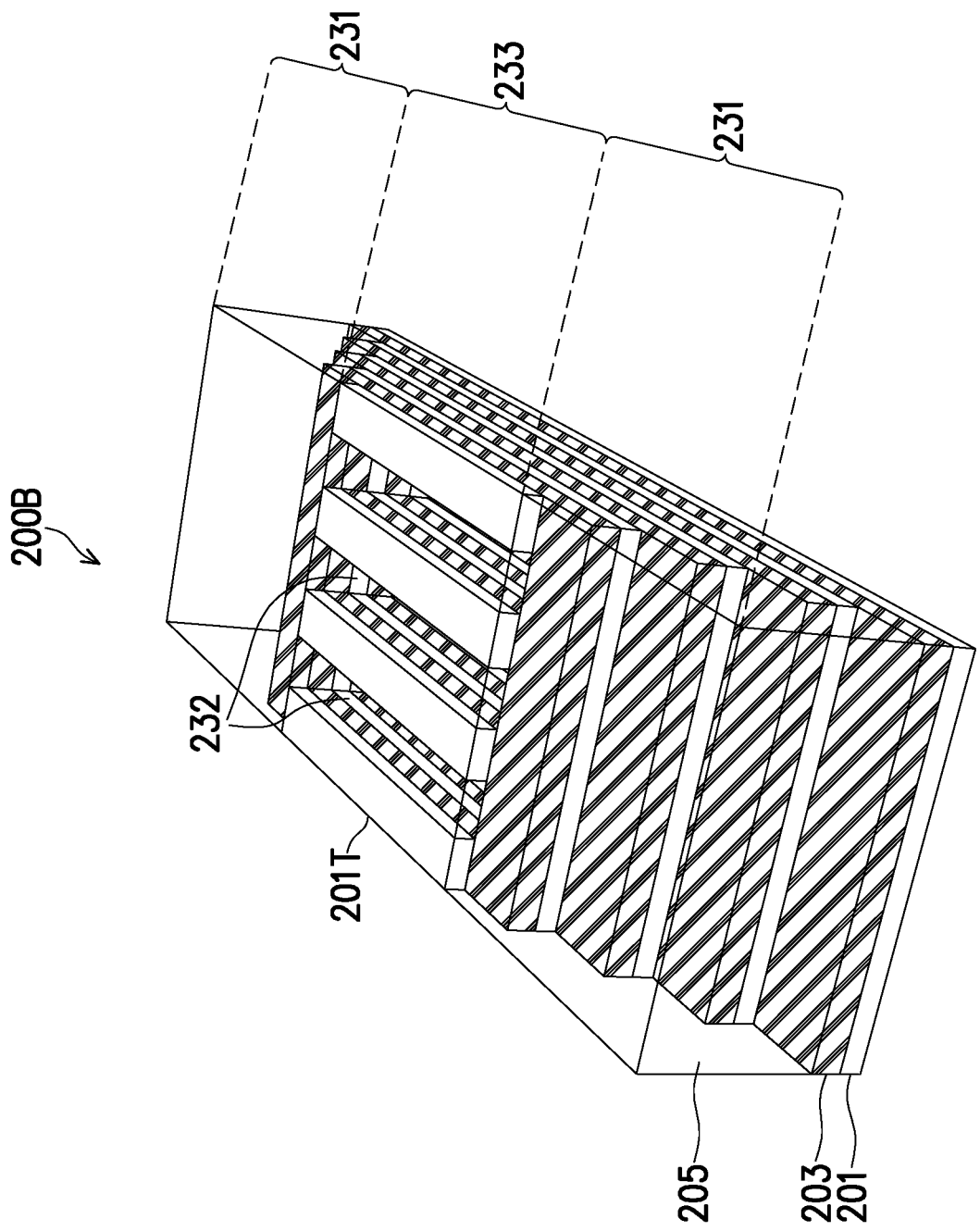
FIGS. 13-19 illustrate perspective views of a three-dimensional (3D) ferroelectric random access memory (FeRAM) device at various stages of manufacturing, in yet another embodiment.

FIGS. 11 and 12 illustrate perspective views of a three-dimensional (3D) ferroelectric random access memory (FeRAM) device 200A at various stages of manufacturing, in another embodiment. The 3D FeRAM device 200A is similar to the 3D FeRAM device 200 of FIG. 10A, but with the channel material 207 and the ferroelectric material 213 removed from the staircase-shaped regions 231. For example, the 3D FeRAM device 200A may be formed by following the processing illustrated in FIGS. 2A, 2B, 3A, 3B, 4-7, 8A, 8B, 8C, 8D, and 8E. Then, at the processing step of FIG. 9, the channel material 207 and the ferroelectric material 213 are removed from the staircase-shaped regions 231, e.g., using one or more selective etching processes. The dielectric material 208 may then be formed to fill the spaces left by the removed portions of the channel material 207 and the removed portions of the ferroelectric material 213. Next, in FIG. 12, the contacts 225 and 227 are formed, following the same or similar processing of FIG. 10A.

FIGS. 13-19 illustrate perspective views of a three-dimensional (3D) ferroelectric random access memory (FeRAM) device 200B at various stages of manufacturing, in yet another embodiment. The 3D FeRAM device 200B is similar to the 3D FeRAM device 200 of FIG. 10A, but with the ferroelectric material 213 and the channel material 207 formed in the memory array region 233 only. In particular, the processing in FIG. 13 follows the processing steps of FIGS. 2A, 2B, 3A, 3B, and 4. After the processing of FIG. 4, trenches 232 are formed in the memory array region 233. The trenches 232 extend through the dielectric layer 201T and the layer stacks 202. In the illustrated embodiments, the length of the trenches 232, measured along the direction of the cross-section B-B (see FIG. 3A), is the same as the length of the memory array region 233. Therefore, trenches 232 do not extend into the staircase-shaped regions 231 in the example of FIG. 13. In other embodiments, the length of the trenches 232 measured along the direction of cross-section B-B is smaller or larger than the length of the memory array region 233.

Figure 14:
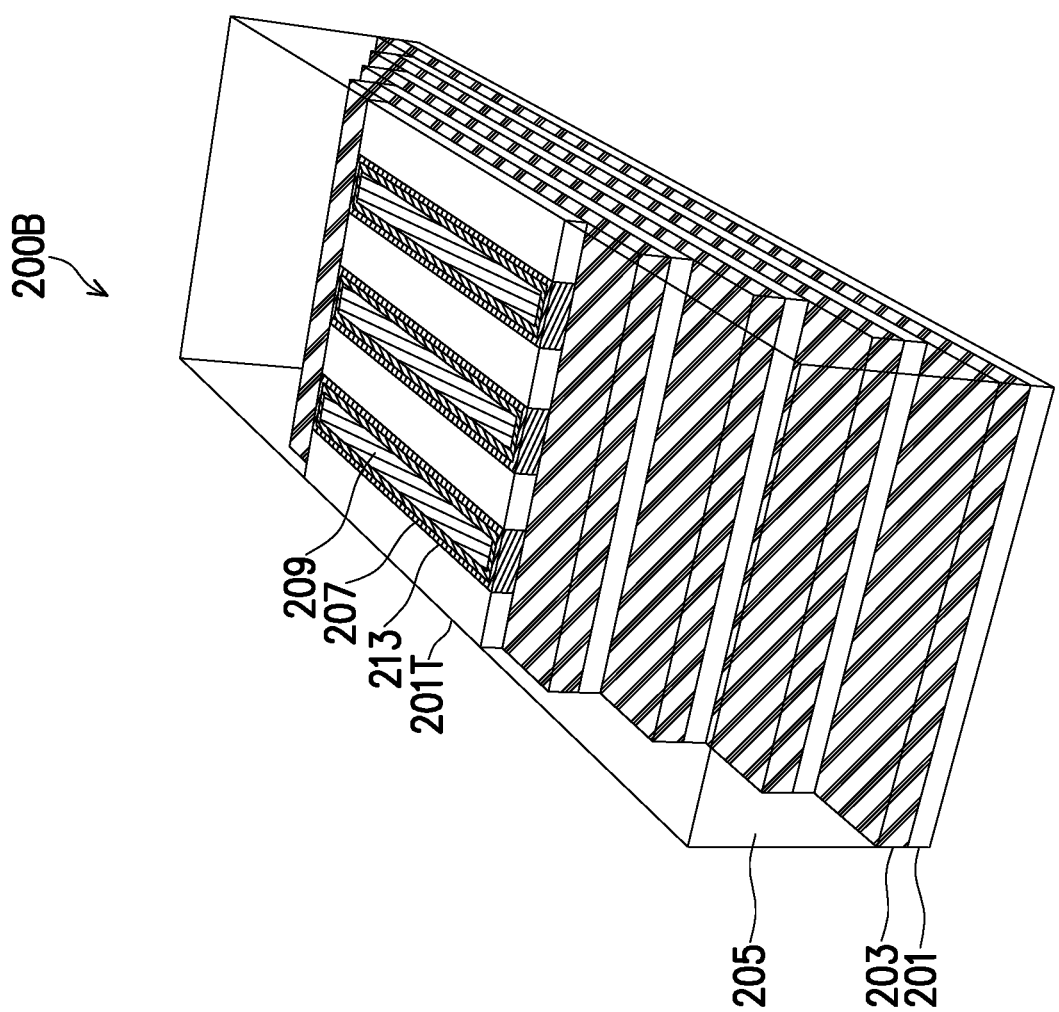

Next, in FIG. 14, the ferroelectric material 213 is formed (e.g., conformally) along sidewalls and bottoms of the trenches 232, and the channel material 207 is formed (e.g., conformally) over the ferroelectric material 213. A dielectric material 209 is then formed over the channel material 207 to fill the trenches 232. A planarization process, such as CMP, may be performed to remove excess portions of the ferroelectric material 213, excess portions of the channel material 207, and excess portions of the dielectric material 209 from the upper surface of the dielectric layer 201T and from the upper surface of the dielectric material 205. The remaining ferroelectric material 213 in the trenches 232 may be referred to as ferroelectric films 213, and the remaining channel material 207 in the trenches 232 may be referred to as channel layers 207.

Figure 15:
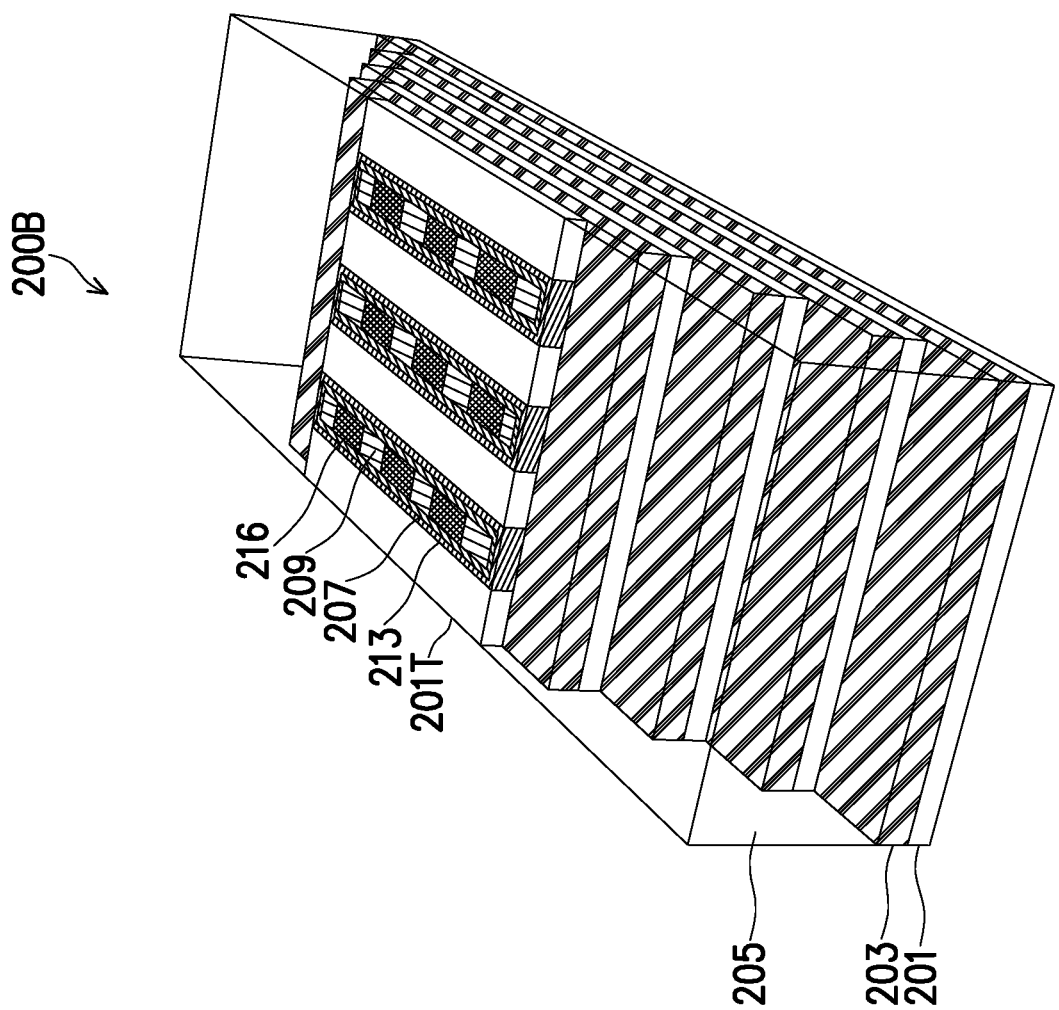
Figure 16:
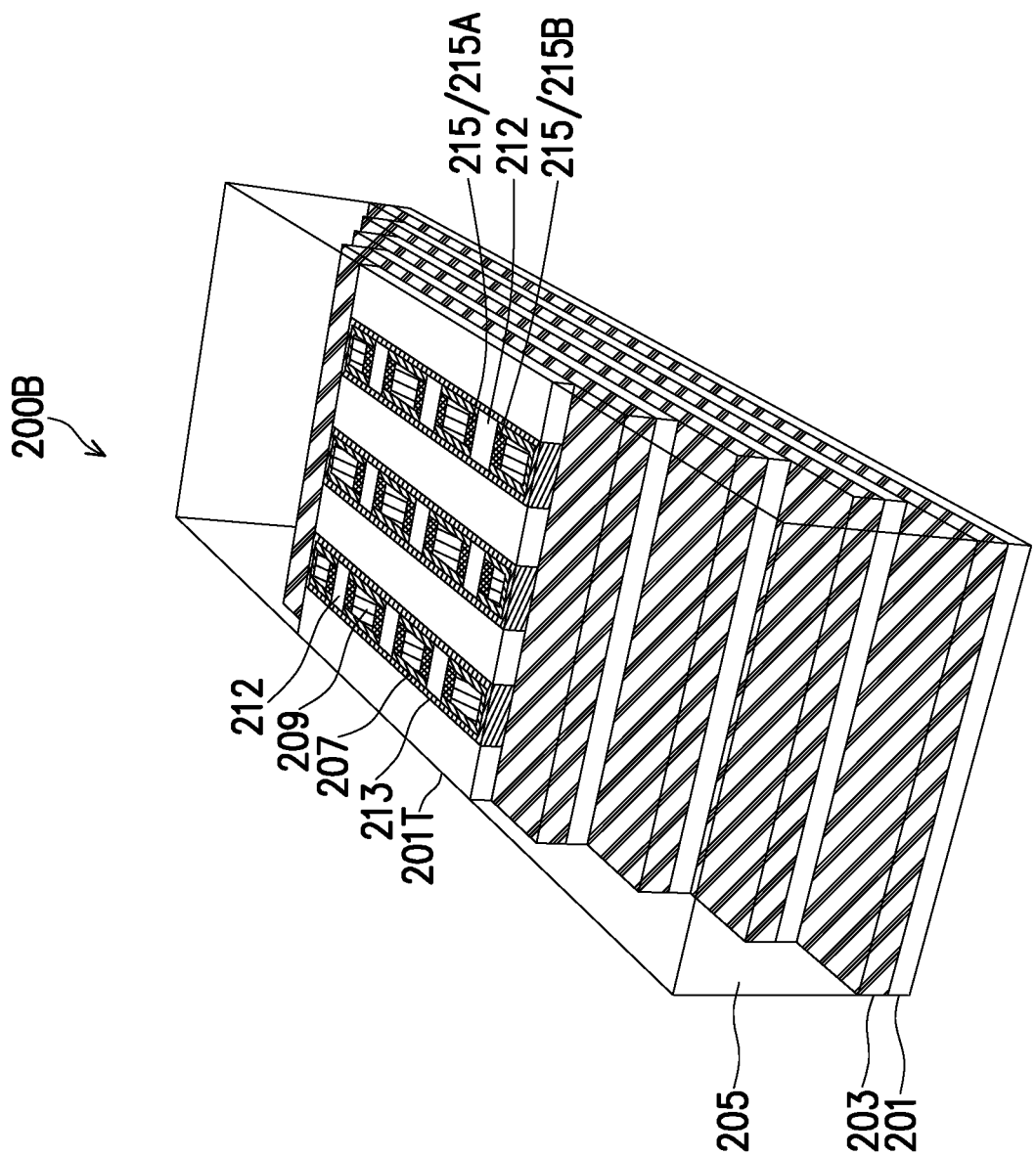

Next, in FIG. 15, conductive lines 216 are formed in the dielectric material 209. Next, in FIG. 16, an isolation region 212 is formed in each of the conductive lines 216 to separate each conductive line 216 into a pair of conductive lines 215A and 215B. Processing are the same as or similar to those discussed above with reference to FIGS. 7 and 8A-8E, thus details are not repeated.

Figure 17:
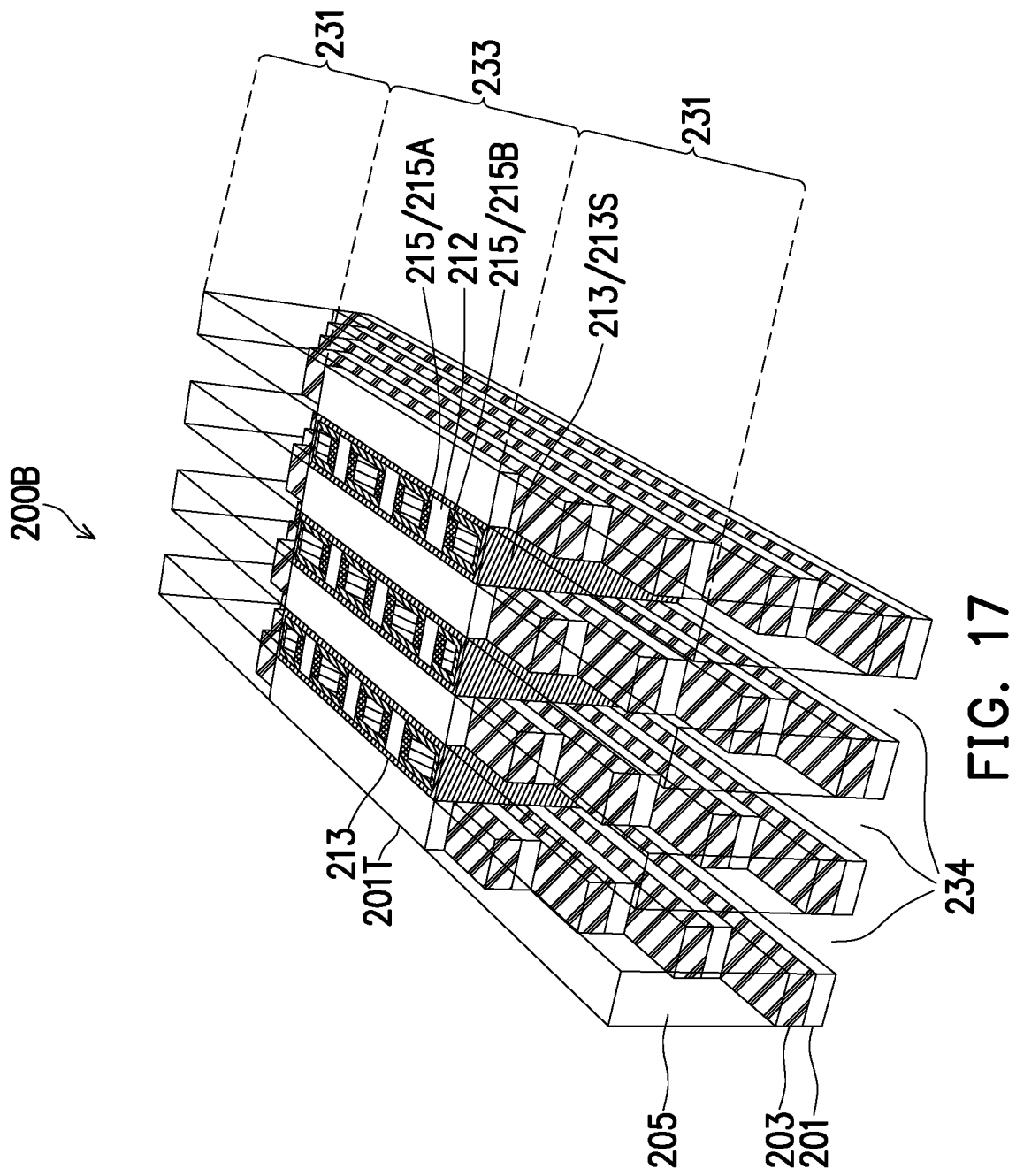

Next, in FIG. 17, trenches 234 are formed in the staircase-shaped regions 231. The trenches 234 extend through the dielectric layer 201T and the layer stacks 202. In some embodiments, the trenches 234 are formed by forming a patterned photoresist over the memory device 200B, wherein patterns (e.g., openings) of the patterned photoresist expose areas of the staircase-shaped regions 231 where the trenches 234 are to be formed. Next, an anisotropic etching process is performed using the patterned photoresist as an etching mask to remove the exposed portions of 3D memory device 200B. As illustrated in FIG. 17, the trenches 234 exposes sidewalls 213S of the ferroelectric material 213. Note that regardless of the length of the trenches 232 in FIG. 13, the dimension of the trenches 234 is adjusted to accommodate the length of the trenches 232 in FIG. 13, such that the sidewalls 213S of the ferroelectric material 213 are exposed by the trenches 234. After the etching process, the patterned photoresist may be removed, e.g., by an ashing or stripping process.

Figure 18:
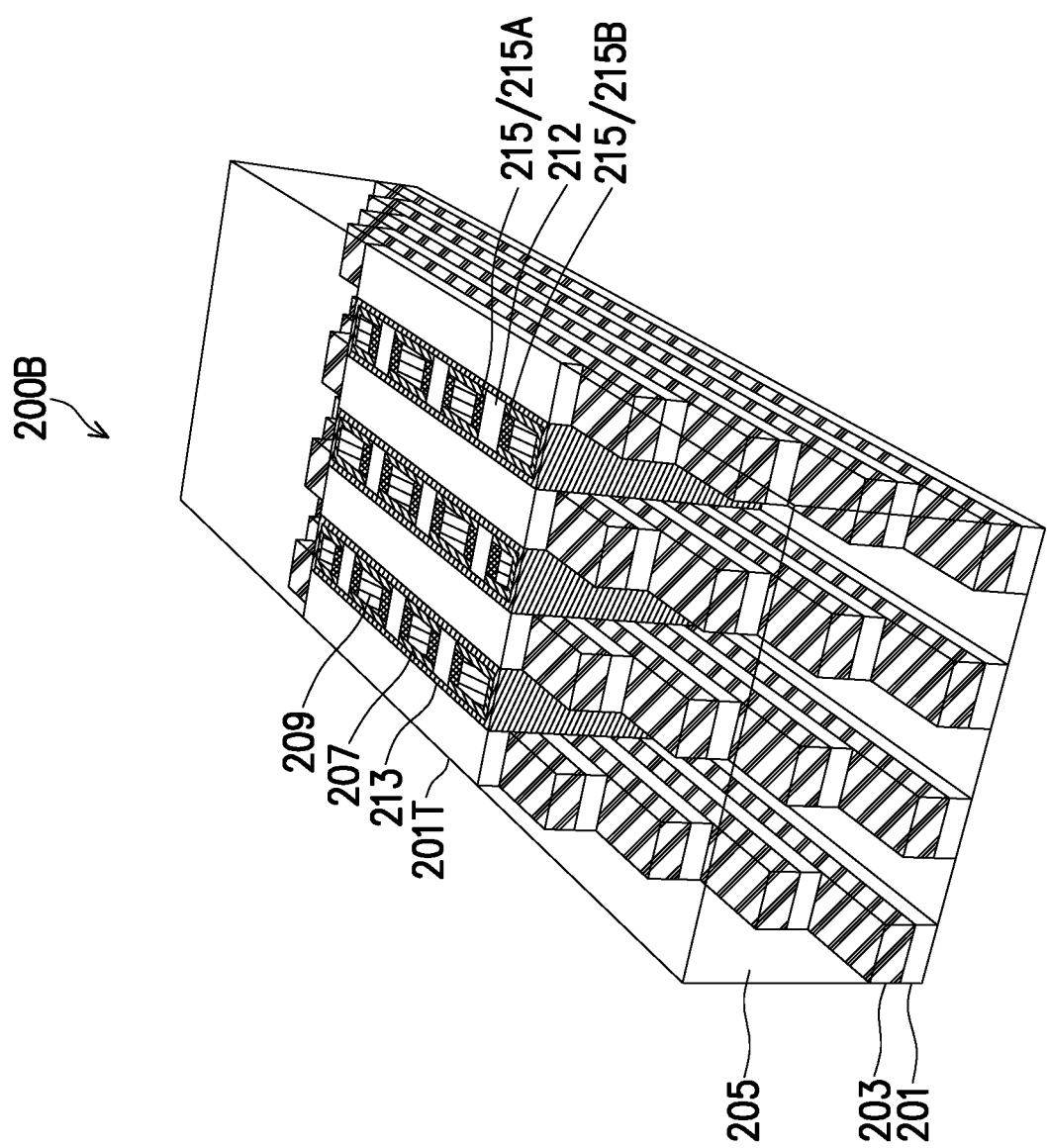

Next, in FIG. 18, a dielectric material is formed to fill the trenches 234. In the illustrated embodiment, the dielectric material filling the trenches 234 is the same as the dielectric material 205, thus the dielectric material 205 in FIG. 17 and the dielectric material filling the trenches 234 may be collectively referred to as dielectric material 205 in FIG. 18. A planarization process, such as CMP, may be performed to expose the upper surface of the dielectric layer 201T and to achieve a coplanar upper surface between the dielectric material 205 and the dielectric layer 201T.

Figure 19:
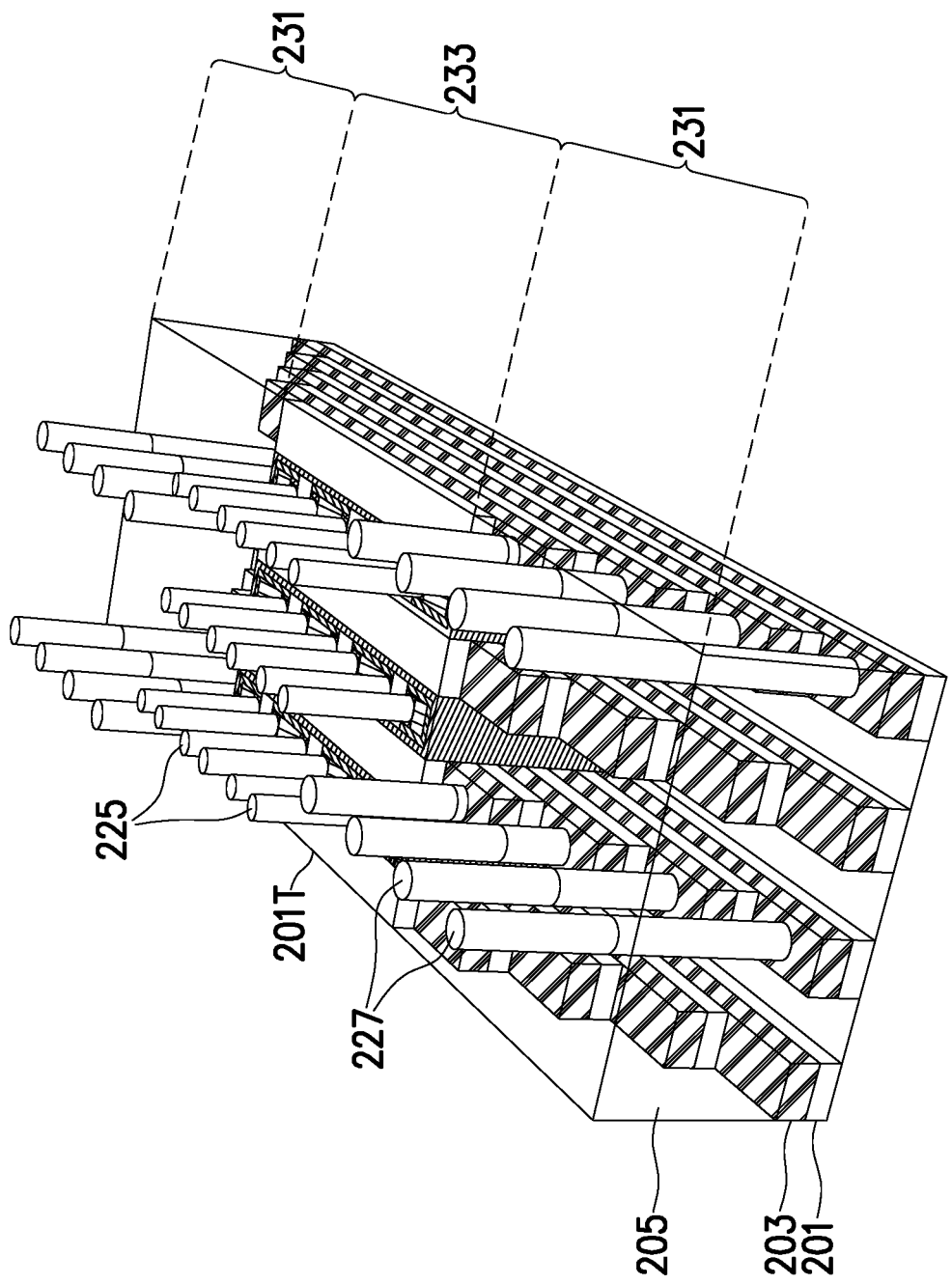

Next, in FIG. 19, contacts 225 are formed over the memory array region 233 and are electrically coupled to respective SLs/BLs 215, and contacts 227 are formed over the staircase-shaped regions 231 and are electrically coupled to respective WLs 203.

Figure 20:
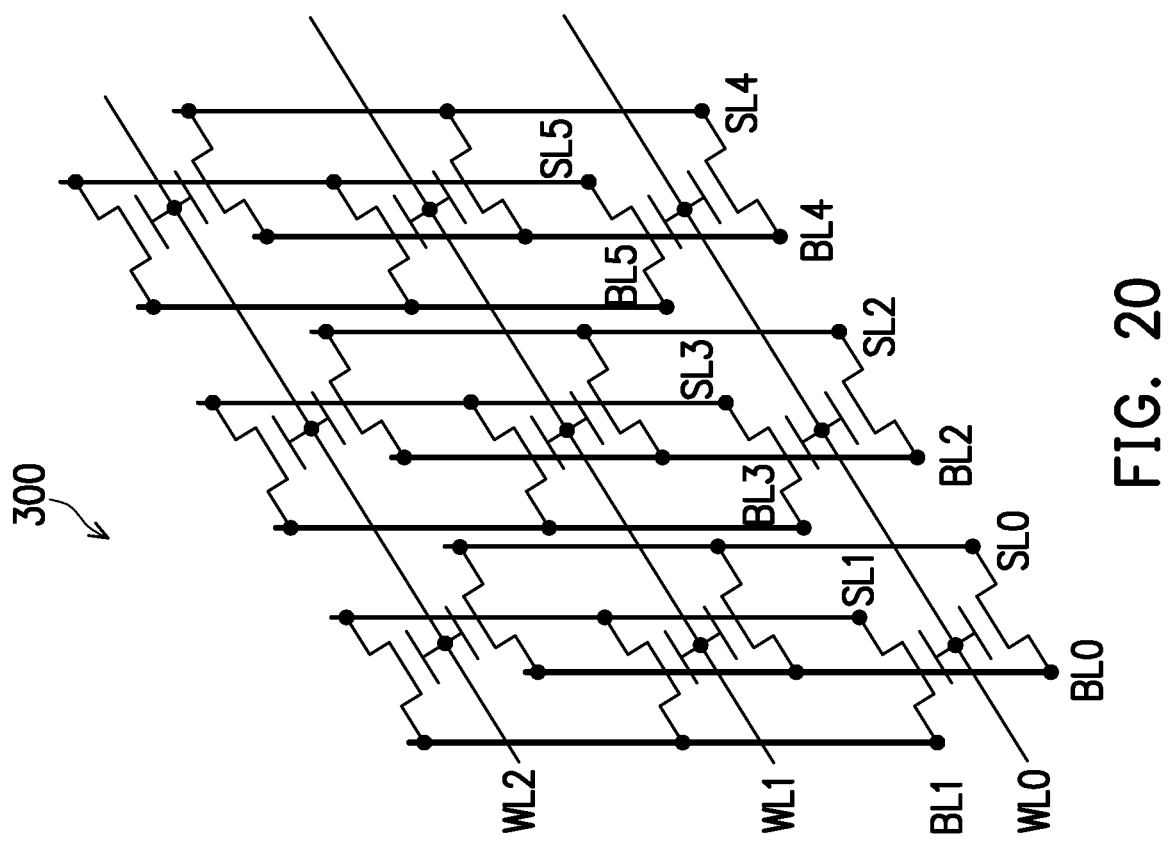
FIG. 20 illustrates an equivalent circuit diagram of a three-dimensional (3D) ferroelectric random access memory (FeRAM) device, in an embodiment.

FIG. 20 illustrates an equivalent circuit diagram 300 of a three-dimensional (3D) ferroelectric random access memory (FeRAM) device, in an embodiment. The circuit diagram 300 may corresponds to a portion of the 3D memory devices disclosed herein, such as 200, 200A, or 200B.

FIG. 20 illustrates three horizontally extending WLs (e.g., WL0, WL1, and WL2) located at three vertical levels, which correspond to three different WLs 203 of the 3D FeRAM devices 200, 200A, or 200B. The memory cells at each vertical level are illustrated as transistors. The gate electrodes of the transistors at a same vertical level are connected to a same WL. FIG. 20 further illustrates vertically extending BLs (e.g., BL0, BL1, . . . , BL5) and SLs (e.g., SL0, SL1, . . . , SL5). The BLs and SLs correspond to, e.g., the BLs 215A and SLs 215B of the embodiment 3D FeRAM devices 200/200A/200B. Each of the BLs and SLs is connected to a plurality of vertically stacked memory cells.

FIG. 21 illustrates a flow chart of a method 1000 of forming a three-dimensional (3D) ferroelectric random access memory (FeRAM) device, in some embodiments. It should be understood that the embodiment method shown in FIG. 21 is merely an example of many possible embodiment methods. One of ordinary skill in the art would recognize many variations, alternatives, and modifications. For example, various steps as illustrated in FIG. 21 may be added, removed, replaced, rearranged, or repeated.

Referring to FIG. 21, at block 1010, a first layer stack and a second layer stack are formed successively over a substrate, wherein the first layer stack and the second layer stack have a same layered structure that includes a layer of a first electrically conductive material over a layer of a first dielectric material, wherein the first layer stack extends beyond lateral extents of the second layer stack. At block 1020, a trench is formed that extends through the first layer stack and the second layer stack. At block 1030, sidewalls and a bottom of the trench are lined with a ferroelectric material. At block 1040, a channel material is formed conformally in the trench over the ferroelectric material. At block 1050, the trench is filled with a second dielectric material. At block 1060, a first opening and a second opening are formed in the second dielectric material. At block 1070, the first opening and the second opening are filled with a second electrically conductive material.

Variations and modifications to the disclosed embodiments are possible and are fully intended to be included within the scope of the present disclosure. For example, four layer stacks 202 (e.g., 202A, 202B, 202C, and 200D) are illustrated in the 3D memory devices 200, 200A, and 200B as non-limiting examples. The number of layer stacks 202 in the 3D memory device can be any suitable number, such as one, two, three, or more than four, as skilled artisans readily appreciate. As another example, the number of trenches (e.g., 206 in FIG. 5, or 232 in FIG. 13) formed may be any suitable number besides the three trenches illustrated. As yet another example, the number of conductive lines 215 formed in each row of dielectric material 209 (e.g., each row formed in a trench) may be any suitable number. As yet another example, the staircase-shaped regions 231 are formed on opposing sides of the memory array region 233 in the illustrated embodiments as non-limiting examples. The memory devices 200, 200A, and 200B may be formed by forming only one staircase-shaped region 231 adjacent to the memory array region 233.

Embodiments may achieve advantages. The disclosed staircase-first process avoids or reduces issues associated with the staircase-last process, such as multiple-film etching challenges and defects (e.g., such as staircase pattern fail induced by nonvolatile by-products of the etching process). As a result, the disclosed staircase-first process achieves better process control and etching profile, while reducing defects and improving production yield and device performance. The disclosed 3D memory devices can be easily integrated into existing semiconductor devices during the BEOL processing. The areas under the 3D memory devices can still be used to form various circuits, such as logic circuits, I/O circuits, or ESD circuits during the FEOL processing. Therefore, besides the peripheral circuits (e.g., decoders, amplifiers) and routing circuits used for the 3D memory devices, there is little penalty in terms of foot print for integrating the disclosed 3D memory devices. In addition, the disclosed 3D memory devices have highly efficient structures to reduce its memory cell size. For example, each BL or SL is shared by multiple vertically stacked memory cells. Each WL is shared by multiple horizontally aligned memory cells formed at same vertical distance from the substrate. As discussed above, the disclosed 3D memory devices have structures that can be scaled easily to allow for high-density memory arrays to be formed, which is important for emerging applications such as Internet of Things (IoT) and machine learning. By integrating the 3D memory arrays on chip during the BEOL processing, issues such as energy consumption bottleneck due to off-chip memory access are avoided. As a result, semiconductor devices with the disclosed 3D memory devices integrated may be made smaller, cheaper, while operating at faster speed and consuming less power.

In accordance with an embodiment, a method of forming a ferroelectric random access memory (FeRAM) device includes: forming a first layer stack and a second layer stack successively over a substrate, wherein each of the first layer stack and the second layer stack has a first dielectric layer and an electrically conductive layer formed over the first dielectric layer; forming a second dielectric layer over the second layer stack; patterning the first layer stack, the second layer stack, and the second dielectric layer, wherein the patterning forms a staircase-shaped region, wherein in the staircase-shaped region, the second layer stack extends beyond lateral extents of the second dielectric layer, and the first layer stack extends beyond lateral extents of the second layer stack, wherein after the patterning, the electrically conductive layers of the first and the second layer stacks form a first word line and a second word line, respectively; after the patterning, forming a trench that extends through the first layer stack, the second layer stack, and the second dielectric layer; lining sidewalls and a bottom of the trench with a ferroelectric material; forming a channel material over the ferroelectric material; filling the trench by forming a dielectric material over the channel material; and forming a source line and a bit line in the dielectric material, wherein the source line and the bit line extend through the second dielectric layer, the second layer stack, and the first layer stack. In an embodiment, in the staircase-shaped region, the second layer stack extends beyond the lateral extents of the second dielectric layer along a first direction, and the first layer stack extends beyond the lateral extents of the second layer stack along the first direction. In an embodiment, the trench is formed to have a longitudinal axis along the first direction. In an embodiment, after the patterning, sidewalls of the patterned second dielectric layer define a memory array region adjacent to the staircase-shaped region. In an embodiment, the trench is formed to extend through the memory array region and the staircase-shaped region. In an embodiment, the method further includes after forming the source line and the bit line, removing the channel material from the staircase-shaped region. In an embodiment, the method further includes after forming the source line and the bit line, removing the channel material and the ferroelectric material from the staircase-shaped region. In an embodiment, the trench is formed within the memory array region. In an embodiment, the bit line and the source line are formed within the memory array region, wherein the method further comprises: forming first contacts over the memory array region and electrically coupled to the bit line and the source line; and forming second contacts over the staircase-shaped region and electrically coupled to the first word line and the second word line. In an embodiment, the source line and the bit line are formed of an electrically conductive material, wherein longitudinal axes of the source line and the bit line are perpendicular to an upper surface of the substrate. In an embodiment, in a top view, the source line and the bit line extend continuously from a first sidewall of the channel material to a second sidewall of the channel material facing the first sidewall of the channel material. In an embodiment, the method further includes: forming another source line in the dielectric material adjacent to the bit line; and forming an isolation region between and contacting the bit line and the another source line, wherein in the top view, the isolation region extends continuously from a first sidewall of the ferroelectric material to a second sidewall of the ferroelectric material facing the first sidewall of the ferroelectric material.

In accordance with an embodiment, a method of forming a ferroelectric random access memory (FeRAM) device includes: forming a first layer stack and a second layer stack successively over a substrate, wherein the first layer stack and the second layer stack have a same layered structure that includes a layer of a first electrically conductive material over a layer of a first dielectric material, wherein the first layer stack extends beyond lateral extents of the second layer stack; forming a trench that extends through the first layer stack and the second layer stack; lining sidewalls and a bottom of the trench with a ferroelectric material; conformally forming a channel material in the trench over the ferroelectric material; filling the trench with a second dielectric material; forming a first opening and a second opening in the second dielectric material; and filling the first opening and the second opening with a second electrically conductive material. In an embodiment, the first layer stack extends beyond the lateral extents of the second layer stack in a first direction, wherein a longitudinal axis of the trench is formed to extend along the first direction. In an embodiment, the trench separates each of the first layer stack and the second layer stack into two separate portions. In an embodiment, the method further includes after filling the first opening and the second opening, removing at least portions of the ferroelectric material that are disposed outside boundaries of the second layer stack. In an embodiment, the trench is formed within an area delimited by sidewalls of the second layer stack.

In accordance with an embodiment, a ferroelectric random access memory (FeRAM) device includes: a first layer stack; a second layer stack over the first layer stack, wherein the first layer stack and the second layer stack have a same layered structure that includes a layer of a first electrically conductive material over a layer of a first dielectric material, wherein the first layer stack extends beyond lateral extents of the second layer stack; a second dielectric material embedded in the first layer stack and the second layer stack, the second dielectric material extending through the first layer stack and the second layer stack; a ferroelectric material between the second dielectric material and the first layer stack, and between the second dielectric material and the second layer stack; a channel material between the ferroelectric material and the second dielectric material; and electrically conductive lines embedded in the second dielectric material, wherein the electrically conductive lines extending through the first layer stack and the second layer stack. In an embodiment, the FeRAM device further includes: a first dielectric layer over the second layer stack, wherein the second layer stack extends beyond lateral extents of the first dielectric layer; and a second dielectric layer over the first layer stack and the second layer stack, wherein an upper surface of the second dielectric layer is level with an upper surface of the first dielectric layer. In an embodiment, the FeRAM device further includes isolation regions embedded in the second dielectric material, wherein the isolation regions extend through the first layer stack and the second layer stack, wherein in a top view, the isolations regions extend continuously from a first sidewall of the ferroelectric material to a second sidewall of the ferroelectric material facing the first sidewall.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of forming a ferroelectric random access memory (FeRAM) device, the method comprising:
    forming a first layer stack and a second layer stack successively over a substrate, wherein each of the first layer stack and the second layer stack has a first dielectric layer and an electrically conductive layer formed over the first dielectric layer;
    forming a second dielectric layer over the second layer stack;
    patterning the first layer stack, the second layer stack, and the second dielectric layer, wherein the patterning forms a staircase-shaped region, wherein in the staircase-shaped region, the second layer stack extends beyond lateral extents of the second dielectric layer, and the first layer stack extends beyond lateral extents of the second layer stack, wherein after the patterning, the electrically conductive layers of the first and the second layer stacks form a first word line and a second word line, respectively;
    after the patterning, forming a trench that extends through the first layer stack, the second layer stack, and the second dielectric layer;
    lining sidewalls and a bottom of the trench with a ferroelectric material;
    forming a channel material over the ferroelectric material;
    filling the trench by forming a dielectric material over the channel material; and
    forming a source line and a bit line in the dielectric material, wherein the source line and the bit line extend through the second dielectric layer, the second layer stack, and the first layer stack.

2. The method of claim 1, wherein in the staircase-shaped region, the second layer stack extends beyond the lateral extents of the second dielectric layer along a first direction, and the first layer stack extends beyond the lateral extents of the second layer stack along the first direction.

3. The method of claim 2, wherein the trench is formed to have a longitudinal axis along the first direction.

4. The method of claim 3, wherein after the patterning, sidewalls of the patterned second dielectric layer define a memory array region adjacent to the staircase-shaped region.

5. The method of claim 4, wherein the trench is formed to extend through the memory array region and the staircase-shaped region.

6. The method of claim 5, further comprising, after forming the source line and the bit line, removing the channel material from the staircase-shaped region.

7. The method of claim 5, further comprising, after forming the source line and the bit line, removing the channel material and the ferroelectric material from the staircase-shaped region.

8. The method of claim 4, wherein the trench is formed within the memory array region.

9. The method of claim 4, wherein the bit line and the source line are formed within the memory array region, wherein the method further comprises:
    forming first contacts over the memory array region and electrically coupled to the bit line and the source line; and
    forming second contacts over the staircase-shaped region and electrically coupled to the first word line and the second word line.

10. The method of claim 1, wherein the source line and the bit line are formed of an electrically conductive material, wherein longitudinal axes of the source line and the bit line are perpendicular to an upper surface of the substrate.

11. The method of claim 10, wherein in a top view, the source line and the bit line extend continuously from a first sidewall of the channel material to a second sidewall of the channel material facing the first sidewall of the channel material.

12. The method of claim 11, further comprising:
    forming another source line in the dielectric material adjacent to the bit line; and
    forming an isolation region between and contacting the bit line and the another source line, wherein in the top view, the isolation region extends continuously from a first sidewall of the ferroelectric material to a second sidewall of the ferroelectric material facing the first sidewall of the ferroelectric material.

13. A method of forming a ferroelectric random access memory (FeRAM) device, the method comprising:
    forming a first layer stack and a second layer stack successively over a substrate, wherein the first layer stack and the second layer stack have a same layered structure that includes a layer of a first electrically conductive material over a layer of a first dielectric material, wherein the first layer stack extends beyond lateral extents of the second layer stack;
    forming a trench that extends through the first layer stack and the second layer stack;
    lining sidewalls and a bottom of the trench with a ferroelectric material;
    conformally forming a channel material in the trench over the ferroelectric material;
    filling the trench with a second dielectric material;
    forming a first opening and a second opening in the second dielectric material; and
    filling the first opening and the second opening with a second electrically conductive material.

14. The method of claim 13, wherein the first layer stack extends beyond the lateral extents of the second layer stack in a first direction, wherein a longitudinal axis of the trench is formed to extend along the first direction.

15. The method of claim 14, wherein the trench separates each of the first layer stack and the second layer stack into two separate portions.

16. The method of claim 15, further comprising:
after filling the first opening and the second opening, removing at least portions of the ferroelectric material that are disposed outside boundaries of the second layer stack.

17. The method of claim 14, wherein the trench is formed within an area delimited by sidewalls of the second layer stack.

18. A ferroelectric random access memory (FeRAM) device comprising:
a first layer stack;
a second layer stack over the first layer stack, wherein the first layer stack and the second layer stack have a same layered structure that includes a layer of a first electrically conductive material over a layer of a first dielectric material, wherein the first layer stack extends beyond lateral extents of the second layer stack;
a second dielectric material embedded in the first layer stack and the second layer stack, the second dielectric material extending through the first layer stack and the second layer stack;
a ferroelectric material between the second dielectric material and the first layer stack, and between the second dielectric material and the second layer stack;
a channel material between the ferroelectric material and the second dielectric material; and
electrically conductive lines embedded in the second dielectric material, wherein the electrically conductive lines extend through the first layer stack and the second layer stack.

19. The FeRAM device of claim 18, further comprising:
a first dielectric layer over the second layer stack, wherein the second layer stack extends beyond lateral extents of the first dielectric layer; and
a second dielectric layer over the first layer stack and the second layer stack, wherein an upper surface of the second dielectric layer is level with an upper surface of the first dielectric layer.

20. The FeRAM device of claim 18, further comprising isolation regions embedded in the second dielectric material, wherein the isolation regions extend through the first layer stack and the second layer stack, wherein in a top view, the isolations regions extend continuously from a first sidewall of the ferroelectric material to a second sidewall of the ferroelectric material facing the first sidewall.

* * * * *